United States Patent
Sasaki et al.

(10) Patent No.: US 8,012,802 B2
(45) Date of Patent: Sep. 6, 2011

(54) METHOD OF MANUFACTURING LAYERED CHIP PACKAGE

(75) Inventors: Yoshitaka Sasaki, Milpitas, CA (US);
Hiroyuki Ito, Milpitas, CA (US);
Atsushi Iijima, Hong Kong (CN)

(73) Assignees: Headway Technologies, Inc., Milpitas;
SAE Magnetics (H.K.) Ltd., Hong Kong (CN)

( * ) Notice: Subject to any disclaimer, the term of this patent is extended or adjusted under 35 U.S.C. 154(b) by 87 days.

(21) Appl. No.: 12/700,217

(22) Filed: Feb. 4, 2010

(65) Prior Publication Data
US 2011/0189820 A1   Aug. 4, 2011

(51) Int. Cl.
*H01L 21/50* (2006.01)

(52) U.S. Cl. ......... 438/109; 438/928; 257/686; 257/777

(58) Field of Classification Search .................. 438/107, 438/108, 109, 459, 692, 928, 959, 977; 148/DIG. 135, DIG. 164; 257/685, 686, 777
See application file for complete search history.

(56) References Cited

U.S. PATENT DOCUMENTS

| | | | | |
|---|---|---|---|---|
| 5,236,118 A * | 8/1993 | Bower et al. ................ | 228/193 |
| 5,380,681 A * | 1/1995 | Hsu ................................ | 438/109 |
| 5,432,999 A * | 7/1995 | Capps et al. ................... | 438/109 |
| 5,517,754 A * | 5/1996 | Beilstein et al. ............... | 29/840 |
| 5,637,536 A * | 6/1997 | Val ................................. | 438/686 |
| 5,953,588 A | 9/1999 | Camien et al. | |
| 7,127,807 B2 | 10/2006 | Yamaguchi et al. | |
| 7,557,439 B1 * | 7/2009 | Sasaki et al. .................. | 257/686 |
| 7,626,257 B2 * | 12/2009 | Knorr ............................ | 257/698 |
| 7,676,912 B2 * | 3/2010 | Sasaki et al. ................... | 29/830 |
| 7,727,806 B2 * | 6/2010 | Uhland et al. ................. | 438/109 |
| 7,745,259 B2 * | 6/2010 | Sasaki et al. .................. | 438/109 |
| 7,767,494 B2 * | 8/2010 | Sasaki et al. .................. | 438/109 |
| 7,843,050 B2 * | 11/2010 | Eng et al. ....................... | 257/686 |
| 7,846,772 B2 * | 12/2010 | Sasaki et al. .................. | 438/109 |
| 7,863,095 B2 * | 1/2011 | Sasaki et al. .................. | 438/107 |
| 7,868,442 B2 * | 1/2011 | Sasaki et al. .................. | 257/686 |
| 7,902,677 B1 * | 3/2011 | Sasaki et al. .................. | 257/777 |
| 7,915,079 B1 * | 3/2011 | Sasaki et al. .................. | 438/107 |
| 7,915,083 B1 * | 3/2011 | Sasaki et al. .................. | 438/109 |
| 7,951,649 B2 * | 5/2011 | Val ................................. | 438/113 |
| 2007/0296073 A1 * | 12/2007 | Wu et al. ....................... | 257/686 |

(Continued)

OTHER PUBLICATIONS

Gann, "Neo-Stacking Technology," *HDI Magazine*, Dec. 1999, pp. 1-4.

*Primary Examiner* — Mary Wilczewski
(74) *Attorney, Agent, or Firm* — Oliff & Berridge, PLC

(57) ABSTRACT

In a method of manufacturing a layered chip package, a layered substructure is fabricated and used to produce a plurality of layered chip packages. The layered substructure includes first to fourth substructures stacked, each of the substructures including an array of a plurality of preliminary layer portions. In the step of fabricating the layered substructure, initially fabricated are first to fourth pre-polishing substructures each having first and second surfaces. Next, the first and second pre-polishing substructures are bonded to each other with the first surfaces facing each other, and then the second surface of the second pre-polishing substructure is polished to form a first stack. Similarly, the third and fourth pre-polishing substructures are bonded to each other and the second surface of the third pre-polishing substructure is polished to form a second stack. Then, the first and second stacks are bonded to each other.

7 Claims, 25 Drawing Sheets

U.S. PATENT DOCUMENTS

| | | | |
|---|---|---|---|
| 2008/0230898 A1* | 9/2008 | Meguro et al. | 257/737 |
| 2008/0230923 A1* | 9/2008 | Jo et al. | 257/777 |
| 2009/0026603 A1* | 1/2009 | Sasaki et al. | 257/691 |
| 2009/0045489 A1* | 2/2009 | Koon et al. | 257/666 |
| 2009/0160065 A1* | 6/2009 | Haba et al. | 257/777 |
| 2009/0305464 A1* | 12/2009 | Howard et al. | 438/109 |
| 2009/0321956 A1 | 12/2009 | Sasaki et al. | |
| 2010/0044879 A1* | 2/2010 | Sasaki et al. | 257/777 |
| 2010/0109137 A1* | 5/2010 | Sasaki et al. | 257/684 |
| 2010/0148337 A1* | 6/2010 | Liu et al. | 257/686 |
| 2010/0200977 A1* | 8/2010 | Sasaki et al. | 257/690 |
| 2010/0261313 A1* | 10/2010 | Toh et al. | 438/109 |
| 2010/0264551 A1* | 10/2010 | Farooq et al. | 257/777 |
| 2010/0285635 A1* | 11/2010 | Jo et al. | 438/109 |
| 2010/0289131 A1* | 11/2010 | Bathan et al. | 257/686 |
| 2010/0327464 A1* | 12/2010 | Sasaki et al. | 257/777 |
| 2011/0039370 A1* | 2/2011 | Gomyo et al. | 438/109 |
| 2011/0050320 A1* | 3/2011 | Gillingham | 327/365 |

* cited by examiner

METHOD OF MANUFACTURING LAYERED CHIP PACKAGE

BACKGROUND OF THE INVENTION

1. Field of the Invention

The present invention relates to a method of manufacturing a layered chip package that includes a plurality of semiconductor chips stacked.

2. Description of the Related Art

In recent years, a reduction in weight and an improvement in performance have been demanded of mobile devices typified by cellular phones and notebook personal computers. Accordingly, there has been a demand for higher integration of electronic components for use in mobile devices. Higher integration of electronic components has been demanded also for achieving an increase in capacity of semiconductor memory.

As an example of highly integrated electronic components, a system-in-package (hereinafter referred to as SiP), especially an SiP utilizing a three-dimensional packaging technology for stacking a plurality of semiconductor chips, has attracting attention in recent years. In the present application, a package that includes a plurality of semiconductor chips (hereinafter, also simply referred to as chips) stacked is called a layered chip package. Since the layered chip package allows a reduction in wiring length, it provides the advantage of allowing acceleration of the operation of circuits and a reduction in stray capacitance of wiring, as well as the advantage of allowing higher integration.

Major examples of the three-dimensional packaging technology for fabricating a layered chip package include a wire bonding method and a through electrode method. According to the wire bonding method, a plurality of chips are stacked on a substrate, and a plurality of electrodes formed on each chip are connected to external connecting terminals formed on the substrate by wire bonding. According to the through electrode method, a plurality of through electrodes are formed in each of the chips to be stacked and inter-chip wiring is performed through the use of the through electrodes.

The wire bonding method has the problem that it is difficult to reduce the distance between the electrodes so as to avoid contact between wires, and the problem that the high resistances of the wires hinder the acceleration of the operation of circuits.

The through electrode method is free from the above-mentioned problems of the wire bonding method. Unfortunately, however, the through electrode method requires a large number of steps for forming the through electrodes in chips, and consequently increases the cost for the layered chip package. According to the through electrode method, forming the through electrodes in chips requires a series of steps as follows: forming a plurality of holes for the plurality of through electrodes in a wafer that is to be cut later into a plurality of chips; forming an insulating layer and a seed layer in the plurality of holes and on the top surface of the wafer; forming a plurality of through electrodes by filling the plurality of holes with metal such as Cu by plating; and removing unwanted portions of the seed layer.

According to the through electrode method, the through electrodes are formed by filling metal into holes having relatively high aspect ratios. Consequently, voids or keyholes are prone to occur in the through electrodes due to poor filling of the holes with metal, so that the reliability of wiring formed by the through electrodes tends to be reduced.

According to the through electrode method, an upper chip and a lower chip are physically joined to each other by connecting the through electrodes of the upper and lower chips by means of, for example, soldering. The through electrode method therefore requires that the upper and lower chips be accurately aligned and then joined to each other at high temperatures. When the upper and lower chips are joined to each other at high temperatures, however, misalignment between the upper and lower chips can occur due to expansion and contraction of the chips, which often results in electrical connection failure between the upper and lower chips.

U.S. Pat. No. 5,953,588 discloses a method of manufacturing a layered chip package as described below. In this method, a plurality of chips cut out from a processed wafer are embedded into an embedding resin and then a plurality of leads are formed to be connected to each chip, whereby a structure called a neo-wafer is fabricated. Next, the neo-wafer is diced into a plurality of structures each called a neo-chip. Each neo-chip includes one or more chips, resin surrounding the chip(s), and a plurality of leads. The plurality of leads connected to each chip each have an end face exposed at a side surface of the neo-chip. Next, a plurality of types of neo-chips are laminated into a stack. In the stack, the respective end faces of the plurality of leads connected to the chips of each layer are exposed at the same side surface of the stack.

Keith D. Gann, "Neo-Stacking Technology", HDI Magazine, December 1999, discloses fabricating a stack by the same method as that disclosed in U.S. Pat. No. 5,953,588, and forming wiring on two side surfaces of the stack.

The manufacturing method disclosed in U.S. Pat. No. 5,953,588 involves a large number of process steps and this raises the cost for the layered chip package. According to the method, after the plurality of chips cut out from a processed wafer are embedded into the embedding resin, the plurality of leads are formed to be connected to each chip to thereby fabricate the neo-wafer, as described above. Accurate alignment between the plurality of chips is therefore required when fabricating the neo-wafer. This is also a factor that raises the cost for the layered chip package.

U.S. Pat. No. 7,127,807 B2 discloses a multilayer module formed by stacking a plurality of active layers each including a flexible polymer substrate with at least one electronic element and a plurality of electrically-conductive traces formed within the substrate. U.S. Pat. No. 7,127,807 B2 further discloses a manufacturing method for a multilayer module as described below. In the manufacturing method, a module array stack is fabricated by stacking a plurality of module arrays each of which includes a plurality of multilayer modules arranged in two orthogonal directions. The module array stack is then cut into a module stack which is a stack of a plurality of multilayer modules. Next, a plurality of conductive lines are formed on the respective side surfaces of the plurality of multilayer modules included in the module stack. The module stack is then separated into individual multilayer modules.

With the multilayer module disclosed in U.S. Pat. No. 7,127,807 B2, it is impossible to increase the proportion of the area occupied by the electronic element in each active layer, and consequently it is difficult to achieve higher integration.

OBJECT AND SUMMARY OF THE INVENTION

It is an object of the present invention to provide a method of manufacturing a layered chip package including a plurality of semiconductor chips stacked, the method allowing the layered chip package to be pass-produced at low cost in a short time.

A layered chip package to be manufactured by a manufacturing method of the present invention includes a main body having a top surface, a bottom surface, and four side surfaces. The main body includes a plurality of layer portions stacked. The plurality of layer portions have their respective semiconductor chips, each of the semiconductor chips having a first surface with a device formed thereon and a second surface opposite to the first surface. The plurality of layer portions include at least two pairs of layer portions, each pair of layer portions being arranged so that the first surfaces of the respective semiconductor chips face each other. The manufacturing method of the present invention is a method of manufacturing a plurality of such layered chip packages.

The method of manufacturing the layered chip packages of the present invention includes the steps of fabricating a layered substructure that includes at least one set of first to fourth substructures stacked; and producing the plurality of layered chip packages by using the layered substructure. Each of the first to fourth substructures includes an array of a plurality of preliminary layer portions, each of the preliminary layer portions being intended to become any one of the plurality of layer portions, the first to fourth substructures being intended to be cut later at the position of the boundary between every adjacent preliminary layer portions.

The step of fabricating the layered substructure includes the steps of:

fabricating first to fourth pre-polishing substructures each by processing a first surface of a semiconductor wafer having the first surface and a second surface that face toward opposite directions, each of the first to fourth pre-polishing substructures including an array of a plurality of pre-semiconductor-chip portions that are intended to become individual semiconductor chips, each of the first to fourth pre-polishing substructures having first and second surfaces that correspond to the first and second surfaces of the semiconductor wafer;

forming a first pre-polishing stack by bonding the first pre-polishing substructure and the second pre-polishing substructure to each other such that the first surface of the first pre-polishing substructure and the first surface of the second pre-polishing substructure face each other;

polishing the second surface of the second pre-polishing substructure of the first pre-polishing stack so that the second pre-polishing substructure is thinned by the polishing into the second substructure to thereby form a first stack that includes the first pre-polishing substructure and the second substructure;

forming a second pre-polishing stack by bonding the third pre-polishing substructure and the fourth pre-polishing substructure to each other such that the first surface of the third pre-polishing substructure and the first surface of the fourth pre-polishing substructure face each other;

polishing the second surface of the third pre-polishing substructure of the second pre-polishing stack so that the third pre-polishing substructure is thinned by the polishing into the third substructure to thereby form a second stack that includes the third substructure and the fourth pre-polishing substructure;

forming a third pre-polishing stack by bonding the first stack and the second stack to each other such that the second substructure and the third substructure face each other;

polishing the second surface of the fourth pre-polishing substructure of the third pre-polishing stack so that the fourth pre-polishing substructure is thinned by the polishing into the fourth substructure and the third pre-polishing stack is thereby made into a third stack; and polishing the second surface of the first pre-polishing substructure of the third stack so that the first pre-polishing substructure is thinned by the polishing into the first substructure.

In the method of manufacturing the layered chip packages of the present invention, the step of fabricating the layered substructure may further include the step of bonding two third stacks to each other such that their respective fourth substructures face each other, each of the two third stacks being formed through a series of steps from the step of fabricating the first to fourth pre-polishing substructures to the step of polishing the second surface of the fourth pre-polishing substructure of the third pre-polishing stack. In such a case, the step of polishing the second surface of the first pre-polishing substructure of the third stack is performed on each of the two third stacks bonded to each other, whereby a layered substructure including two sets of the first to fourth substructures stacked is fabricated.

In the method of manufacturing the layered chip packages of the present invention, the layered substructure may include an array of a plurality of pre-separation main bodies that are to be separated from each other later into individual main bodies. The step of producing the plurality of layered chip packages may include the step of separating the plurality of pre-separation main bodies from each other by cutting the layered substructure.

In the method of manufacturing the layered chip packages of the present invention, each of the layered chip packages may further include wiring disposed on at least one of the side surfaces of the main body, and a plurality of electrodes that electrically connect at least one of the semiconductor chips to the wiring. In such a case, the step of producing the plurality of layered chip packages may include the steps of: forming a block by cutting the layered substructure, the block including a plurality of pre-separation main bodies that are to be separated from each other later into individual main bodies; forming the wiring on the plurality of pre-separation main bodies included in the block simultaneously; and separating the plurality of pre-separation main bodies each having the wiring from each other so as to form the plurality of layered chip packages.

Each of the layered chip packages may further include a plurality of terminals that are disposed on at least one of the top surface and the bottom surface of the main body and are electrically connected to the wiring. In such a case, the layered substructure may include an array of a plurality of pre-separation main bodies that are to be separated from each other later into individual main bodies. The step of fabricating the layered substructure may further include the step of forming the plurality of terminals corresponding to a plurality of main bodies simultaneously. The step of producing the plurality of layered chip packages may include the step of separating the plurality of pre-separation main bodies from each other after the formation of the plurality of terminals so as to form the plurality of layered chip packages.

According to the method of manufacturing the layered chip packages of the present invention, it is possible to mass-produce the layered chip packages at low cost in a short time.

Other and further objects, features and advantages of the present invention will appear more fully from the following description.

DETAILED DESCRIPTION OF THE PREFERRED EMBODIMENT

Figure 1:
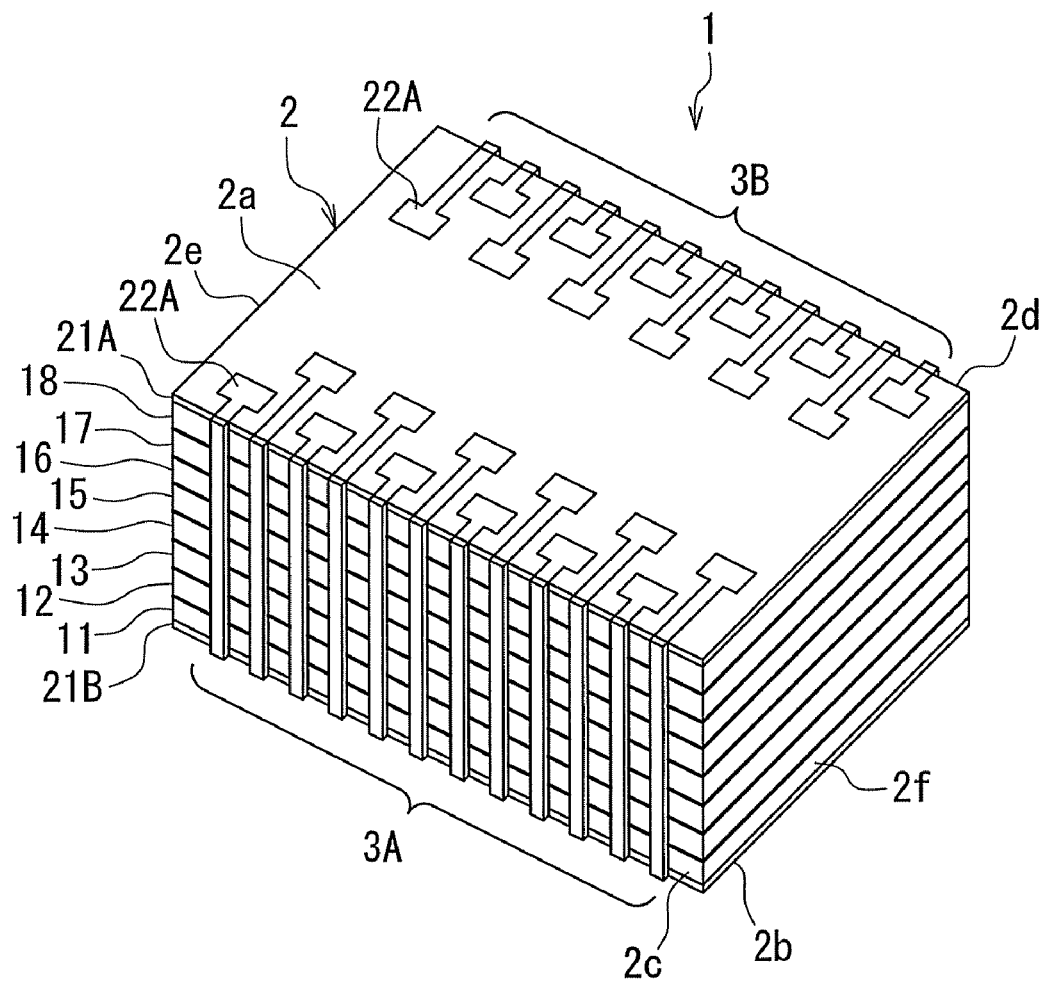
FIG. 1 is a perspective view of a layered chip package according to an embodiment of the invention.
Figure 2:
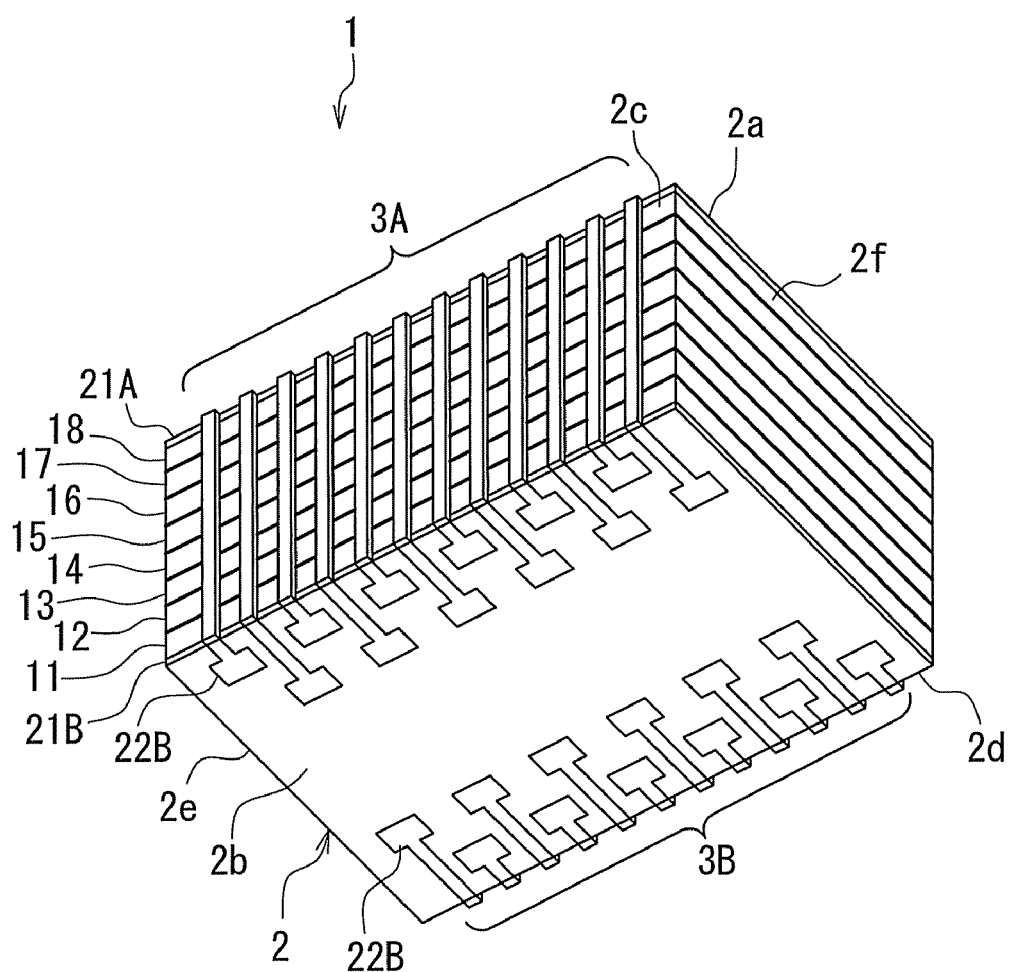
FIG. 2 is a perspective view showing the layered chip package of FIG. 1 as viewed from below.

A preferred embodiment of the present invention will now be described in detail with reference to the drawings. Reference is first made to FIG. 1 and FIG. 2 to describe the configuration of a layered chip package according to the embodiment of the invention. FIG. 1 is a perspective view of the layered chip package according to the present embodiment. FIG. 2 is a perspective view showing the layered chip package of FIG. 1 as viewed from below. As shown in FIG. 1 and FIG. 2, the layered chip package 1 according to the present embodiment includes a main body 2 in the shape of a rectangular solid. The main body 2 has a top surface 2a, a bottom surface 2b, a first side surface 2c and a second side surface 2d facing toward opposite directions, and a third side surface 2e and a fourth side surface 2f facing toward opposite directions.

The layered chip package 1 further includes wiring disposed on at least one of the side surfaces of the main body 2. In the example shown in FIG. 1 and FIG. 2, the layered chip package 1 includes first wiring 3A disposed on the first side surface 2c of the main body 2, and second wiring 3B disposed on the second side surface 2d of the main body 2. Hereinafter, any wiring will be generally designated by reference numeral 3.

The layered chip package 1 further includes a plurality of pad-shaped terminals that are disposed on at least one of the top surface 2a and the bottom surface 2b of the main body 2 and are electrically connected to the wiring 3. In the example shown in FIG. 1 and FIG. 2, the layered chip package 1 includes a plurality of first terminals 22A disposed on the top surface 2a of the main body 2 and a plurality of second terminals 22B disposed on the bottom surface 2b of the main body 2.

The main body 2 includes a plurality of layer portions stacked. By way of example, FIG. 1 and FIG. 2 show a case where the main body 2 includes eight layer portions 11, 12, 13, 14, 15, 16, 17 and 18 that are stacked in this order from the bottom. The number of the layer portions to be included in the main body 2 is not limited to eight, and may be any plural number. In the following description, any layer portion will be generally designated by reference numeral 10. Every two vertically adjacent layer portions 10 are bonded to each other with an adhesive. Each of the layer portions 11 to 18 has a top surface, a bottom surface, and four side surfaces.

The main body 2 further includes an insulating layer 21A that is disposed on the uppermost layer portion 18 and surrounds the plurality of terminals 22A, and an insulating layer 21B that is disposed under the lowermost layer portion 11 and surrounds the plurality of terminals 22B. The first terminals 22A and the second terminals 22B function as external connecting terminals of the layered chip package 1.

Some of the plurality of first terminals 22A have their respective end faces located in the position corresponding to the side surface 2c of the main body 2, and the first wiring 3A is connected to these end faces. Other some of the first terminals 22A have their respective end faces located in the position corresponding to the side surface 2d of the main body 2, and the second wiring 3B is connected to these end faces.

Similarly, some of the plurality of second terminals 22B have their respective end faces located in the position corresponding to the side surface 2c of the main body 2, and the first wiring 3A is connected to these end faces. Other some of the second terminals 22B have their respective end faces located in the position corresponding to the side surface 2d of the main body 2, and the second wiring 3B is connected to these end faces.

Figure 3:
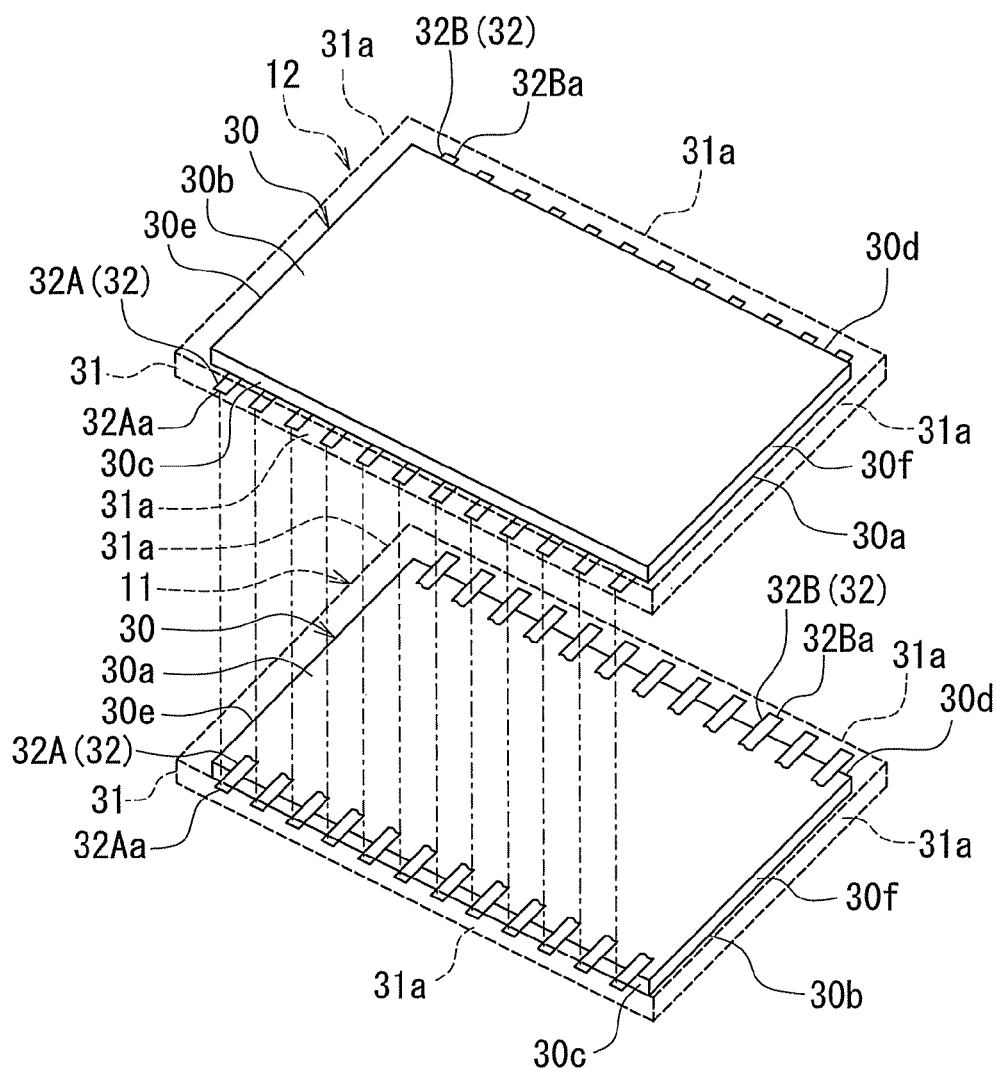
FIG. 3 is an exploded perspective view of a pair of layer portions included in the layered chip package of FIG. 1.

FIG. 3 is an exploded perspective view of a pair of layer portions included in the layered chip package 1 shown in FIG. 1 and FIG. 2. While FIG. 3 shows a pair of layer portions 11 and 12 only, a pair of layer portions 13 and 14, a pair of layer portions 15 and 16, and a pair of layer portions 17 and 18 each have the same configuration as the pair of layer portions 11 and 12 shown in FIG. 3.

As shown in FIG. 3, each of the layer portions 11 and 12 includes a semiconductor chip 30. The semiconductor chip 30 has a first surface 30a with a device formed thereon, a second surface 30b opposite to the first surface 30a, a first side surface 30c and a second side surface 30d facing toward opposite directions, and a third side surface 30e and a fourth side surface 30f facing toward opposite directions. The side surfaces 30c, 30d, 30e and 30f respectively face toward the side surfaces 2c, 2d, 2e and 2f of the main body 2. The layer portions 11 and 12 are arranged so that the first surfaces 30a of their respective semiconductor chips 30 face each other. In the layered chip package 1 according to the present embodiment, the plurality of layer portions 10 include at least two pairs of layer portions 10, each pair of layer portions 10 being arranged so that the first surfaces 30a of the respective semiconductor chips 30 face each other. In the example shown in FIG. 1 and FIG. 2, the plurality of layer portions 10 include four pairs of layer portions 10.

Each of the layer portions 11 and 12 further includes an insulating portion 31 that covers at least one of the four side surfaces of the semiconductor chip 30, and a plurality of electrodes 32 that are connected to the semiconductor chip 30. The insulating portion 31 has at least one end face 31a located in the at least one of the side surfaces of the main body 2 on which the wiring is disposed. In the example shown in FIG. 3, the insulating portion 31 covers all the four side surfaces of the semiconductor chip 30, and has four end faces 31a that are respectively located in the four side surfaces of the main body 2. In this example, the insulating portion 31 also covers the first surface 30a of the semiconductor chip 30.

In the example shown in FIG. 3, the plurality of electrodes 32 include a plurality of first electrodes 32A and a plurality of second electrodes 32B. Each of the plurality of first electrodes 32A has an end face 32Aa that is located in the first side surface 2c of the main body 2 and surrounded by the insulating portion 31. Each of the plurality of second electrodes 32B has an end face 32Ba that is located in the second side surface 2d of the main body 2 and surrounded by the insulating portion 31. The first wiring 3A disposed on the first side surface 2c of the main body 2 is connected to the end faces 32Aa of the plurality of first electrodes 32A of the plurality of layer portions 10. The second wiring 3B disposed on the second side surface 2d of the main body 2 is connected to the end faces 32Ba of the plurality of second electrodes 32B of the plurality of layer portions 10. In the following description, any electrode will be generally designated by reference numeral 32, and the end face of any electrode 32 will be generally designated by reference numeral 32a.

The semiconductor chip 30 may be a memory chip that constitutes a memory such as a flash memory, DRAM, SRAM, MRAM, PROM, or FeRAM. In such a case, it is possible to implement a large-capacity memory by using the layered chip package 1 including a plurality of semiconductor chips 30. With the layered chip package 1 according to the present embodiment, it is also possible to easily implement a memory of various capacities such as 64 GB (gigabytes), 128 GB, and 256 GB, by changing the number of the semiconductor chips 30 to be included in the layered chip package 1.

The layered chip package 1 may include a plurality of semiconductor chips 30 serving as memory chips that constitute different types of memory. The layered chip package 1 may include a semiconductor chip 30 that serves as a memory chip, and another semiconductor chip 30 that serves as a controller for controlling the memory chip.

The semiconductor chips 30 are not limited to memory chips, and may be used for implementing other devices such as CPUs, sensors, and driving circuits for sensors. The layered chip package 1 according to the present embodiment is particularly suitable for implementing an SiP.

If the yield of the semiconductor chips 30 is high, a large number of layer portions, such as eight or sixteen, may be included in the main body 2 since there is a low possibility of reworking (remaking) of the layered chip package 1 that is necessitated by the presence of defective semiconductor chips 30 in the layered chip package 1. On the other hand, if the yield of the semiconductor chips 30 is low, it is preferred that the number of the layer portions to be included in the main body 2 be small, such as four, so as to facilitate reworking of the layered chip package 1.

Figure 4:
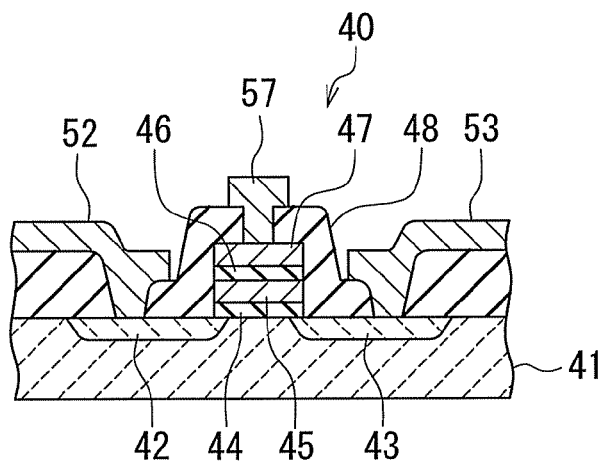
FIG. 4 is a cross-sectional view showing a part of the device included in the semiconductor chip.

Reference is now made to FIG. 4 to describe an example of the device included in the semiconductor chip 30. By way of example, the following description will be given for a case where the device included in the semiconductor chip 30 is a circuit including a plurality of memory cells that constitute a memory. FIG. 4 shows one of the plurality of memory cells. The memory cell 40 includes a source 42 and a drain 43 formed near a surface of a P-type silicon substrate 41. The source 42 and the drain 43 are both N-type regions. The source 42 and the drain 43 are disposed at a predetermined distance from each other so that a channel composed of a part of the P-type silicon substrate 41 is provided between the source 42 and the drain 43. The memory cell 40 further includes an insulating film 44, a floating gate 45, an insulating film 46, and a control gate 47 that are stacked in this order on the surface of the substrate 41 at the location between the source 42 and the drain 43. The memory cell 40 further includes an insulating layer 48 that covers the source 42, the drain 43, the insulating film 44, the floating gate 45, the insulating film 46 and the control gate 47. The insulating layer 48 has contact holes that open in the tops of the source 42, the drain 43 and the control gate 47, respectively. The memory cell 40 includes a source electrode 52, a drain electrode 53, and a control gate electrode 57 that are formed on the insulating layer 48 at locations above the source 42, the drain 43 and the control gate 47, respectively. The source electrode 52, the drain electrode 53 and the control gate electrode 57 are connected to the source 42, the drain 43 and the control gate 47, respectively, through the corresponding contact holes.

Next, a description will be given of a method of manufacturing the layered chip package 1 according to the present embodiment. The method of manufacturing the layered chip package 1 according to the present embodiment includes the steps of fabricating a layered substructure that includes at least one set of first to fourth substructures stacked; and producing a plurality of layered chip packages 1 using the layered substructure. Each of the first to fourth substructures includes an array of a plurality of preliminary layer portions, each of the preliminary layer portions being intended to become any one of the plurality of layer portion 10. The first to fourth substructures are to be cut later at the position of the boundary between every adjacent preliminary layer portions.

With reference to FIG. 5 to FIG. 22, a detailed description will now be given of the step of fabricating the layered substructure in the method of manufacturing the layered chip package 1 according to the present embodiment. In the step of fabricating the layered substructure, first, a plurality of pre-substructure wafers are fabricated. The plurality of pre-substructure wafers correspond to the plurality of layer portions 10 of the layered chip package 1, respectively.

Figure 5:
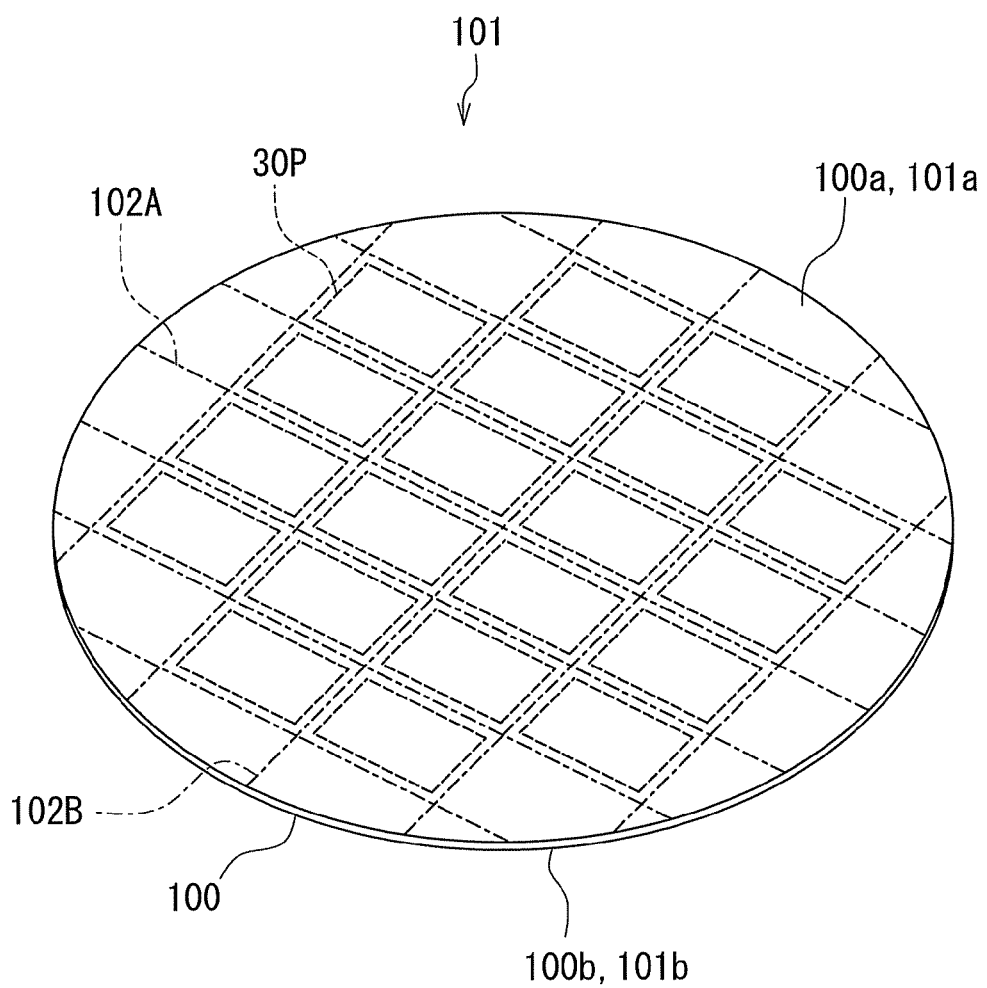
FIG. 5 is a perspective view showing a pre-substructure wafer fabricated in a step of a method of manufacturing the layered chip package according to the embodiment of the invention.
Figure 6:
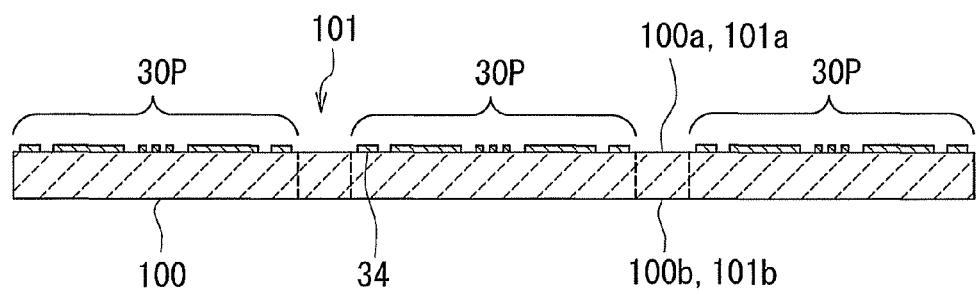
FIG. 6 is a cross-sectional view showing a part of the pre-substructure wafer shown in FIG. 5.

Here, the step of fabricating a single pre-substructure wafer will be described with reference to FIG. 5 and FIG. 6. FIG. 5 is a perspective view of the pre-substructure wafer. FIG. 6 is a cross-sectional view showing a part of the pre-substructure of FIG. 5. In the step of fabricating a single pre-substructure wafer, a pre-substructure wafer 101 is fabricated by performing processing, such as a wafer process, on a first surface 100a of a single semiconductor wafer 100 having the first surface 100a and a second surface 100b facing toward opposite directions. The pre-substructure wafer 101 includes an array of a plurality of pre-semiconductor-chip portions 30P that are intended to become individual semiconductor chips 30 later, each of the pre-semiconductor-chip portions 30P including a device. The pre-substructure wafer 101 has a first surface 101a corresponding to the first surface 100a of the semiconductor wafer 100, and a second surface 101b corresponding to the second surface 100b of the semiconductor wafer 100. In the pre-substructure wafer 101, the plurality of pre-semiconductor-chip portions 30P may be in a row, or in a plurality of rows such that a number of pre-semiconductor-chip portions 30P are arranged both in vertical and horizontal directions. In the following description, assume that the plurality of pre-semiconductor-chip portions 30P in the pre-substructure wafer 101 are in a plurality of rows such that a number of pre-semiconductor-chip portions 30P are arranged both in vertical and horizontal directions.

The semiconductor wafer 100 may be a silicon wafer, for example. The wafer process is a process in which a semiconductor wafer is processed into a plurality of devices that are not yet separated into a plurality of chips. In the pre-substructure wafer 101, the first surface 101a is a device formation surface on which devices are formed. As shown in FIG. 6, each of the plurality of pre-semiconductor-chip portions 30P has a plurality of pad-shaped terminals 34 disposed on the first surface 101a of the pre-substructure wafer 101.

As shown in FIG. 5, the pre-substructure wafer 101 is provided with a plurality of scribe lines 102A and a plurality of scribe lines 102B. The scribe lines 102A extend horizontally to pass through boundaries between every two pre-semiconductor-chip portions 30P that are vertically adjacent to each other. The scribe lines 102B extend vertically to pass through boundaries between every two pre-semiconductor-chip portions 30P that are horizontally adjacent to each other.

A plurality of pre-substructure wafers 101 are each fabricated through the step that has been described with reference to FIG. 5 and FIG. 6.

Figure 7:
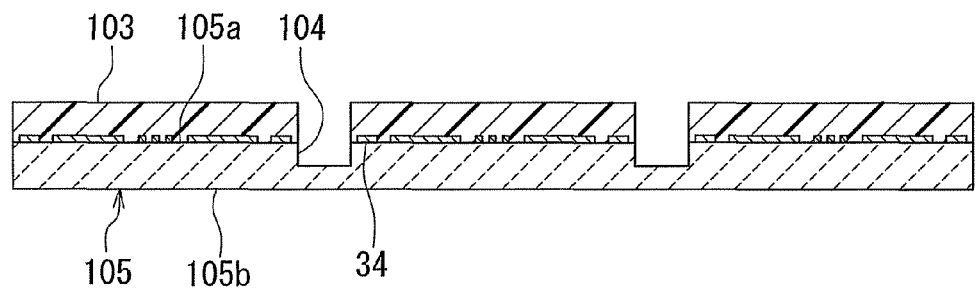
FIG. 7 is a cross-sectional view showing a part of a pre-polishing substructure main body fabricated in a step that follows the step of FIG. 6.

FIG. 7 shows a step that follows the step of FIG. 6. In this step, a protection film 103 made of, for example, photoresist, is initially formed to cover the entire first surface 101a of the pre-substructure wafer 101. Next, at least one groove 104 is formed in the pre-substructure wafer 101. The at least one groove 104 opens in the first surface 101a of the pre-substructure wafer 101 and extends to be adjacent to at least one of the pre-semiconductor-chip portions 30P. Here, a plurality of grooves 104 are formed as shown in FIG. 7. At the positions of the boundaries between every two adjacent pre-semiconductor-chip portions 30P, the grooves 104 are formed to pass through the boundaries between every two adjacent pre-semiconductor-chip portions 30P. In this way, a pre-polishing substructure main body 105 is formed by the pre-substructure wafer 101 having undergone the formation of the plurality of grooves 104 therein. The pre-polishing substructure main body 105 includes an array of pre-semiconductor-chip portions 30P. The pre-polishing substructure main body 105 has a first surface 105a and a second surface 105b. The first surface 105a corresponds to the first surface 100a of the semiconductor wafer 100 and the first surface 101a of the pre-substructure wafer 101. The second surface 105b corresponds to the second surface 100b of the semiconductor wafer 100 and the second surface 101b of the pre-substructure wafer 101. The pre-polishing substructure main body 105 further has the plurality of grooves 104 that open in the first surface 105a. In the pre-polishing substructure main body 105, the first surface 105a is a device formation surface on which devices are formed.

The plurality of grooves 104 are formed along the scribe lines 102A and 102B shown in FIG. 5. The grooves 104 are formed such that their bottoms do not reach the second surface 101b of the pre-substructure wafer 101. The grooves 104 are each 10 to 150 μm wide, for example. The grooves 104 are each 30 to 150 μm deep, for example. The grooves 104 may be formed by using a dicing saw, or by performing etching such as reactive ion etching.

Figure 12:
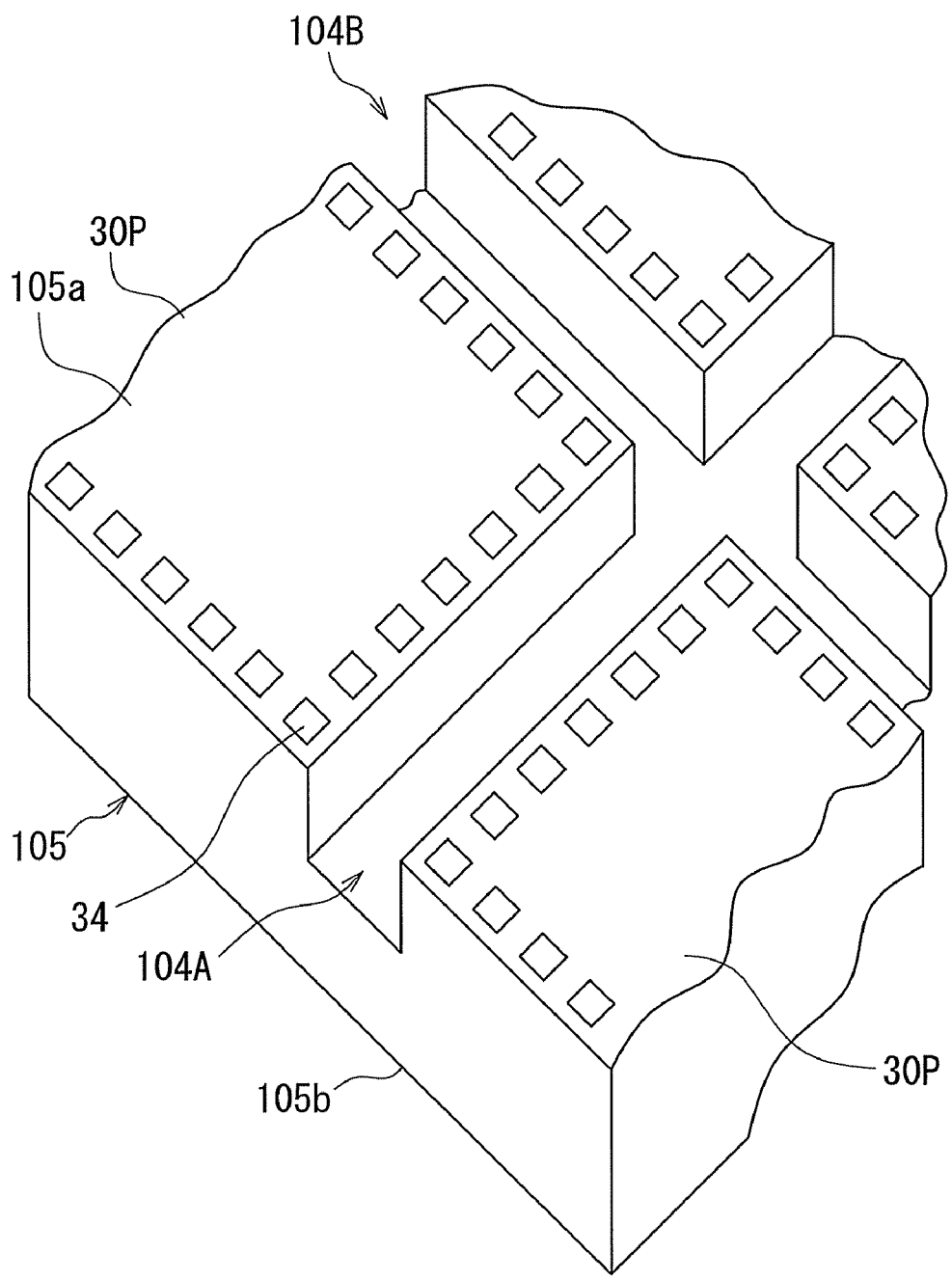
FIG. 12 is a perspective view showing a part of the pre-polishing substructure main body fabricated in the step of FIG. 7.

FIG. 12 shows a part of the pre-polishing substructure main body 105 fabricated in the step of FIG. 7. In the present embodiment, the plurality of grooves 104 include a plurality of first grooves 104A and a plurality of second grooves 104B. The first grooves 104A and the second grooves 104B extend in directions orthogonal to each other. FIG. 12 shows only one each of the first and second grooves 104A and 104B. The first grooves 104A are formed along the scribe lines 102A shown in FIG. 5, and the second grooves 104B are formed along the scribe lines 102B shown in FIG. 5.

Figure 8:
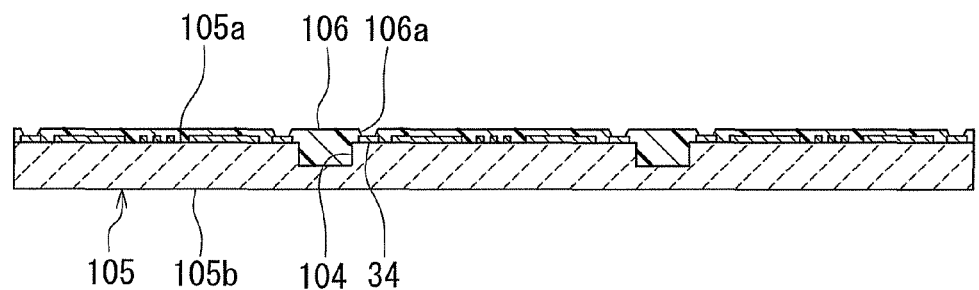
FIG. 8 is a cross-sectional view showing a part of a structure fabricated in a step that follows the step of FIG. 7.

FIG. 8 shows a step that follows the step of FIG. 7. In this step, first, an insulating layer 106 is formed to fill the plurality of grooves 104 of the pre-polishing substructure main body 105 and to cover the plurality of terminals 34. The insulating layer 106 is to become part of the insulating portion 31 later. Next, a plurality of openings 106a for exposing the terminals 34 are formed in the insulating layer 106.

The insulating layer 106 may be formed of a resin such as an epoxy resin or a polyimide resin. The insulating layer 106 may also be formed of a photosensitive material such as a polyimide resin containing a sensitizer. If the insulating layer 106 is formed of a photosensitive material, the openings 106a of the insulating layer 106 may be formed by photolithography. If the insulating layer 106 is formed of a non-photosensitive material, the openings 106a of the insulating layer 106 may be formed by selectively etching the insulating layer 106.

The insulating layer 106 may include a first layer that fills the grooves 104, and a second layer that covers the first layer and the terminals 34. In this case, the openings 106a are formed in the second layer. Both of the first layer and the second layer may be formed of a resin such as an epoxy resin or a polyimide resin. The second layer may be formed of a photosensitive material such as a polyimide resin containing a sensitizer. If the second layer is formed of a photosensitive material, the openings 106a may be formed in the second layer by photolithography. If the second layer is formed of a non-photosensitive material, the openings 106a may be formed in the second layer by selectively etching the second layer.

The insulating layer 106 is preferably formed of a resin having a low thermal expansion coefficient. Forming the insulating layer 106 of a resin having a low thermal expansion coefficient serves to facilitate cutting of the insulating layer 106 when the insulating layer 106 is cut later with a dicing saw.

The insulating layer 106 is preferably transparent. If the insulating layer 106 is transparent, alignment marks that are to be formed on the insulating layer 106 later are easily recognizable through the insulating layer 106.

Figure 9:
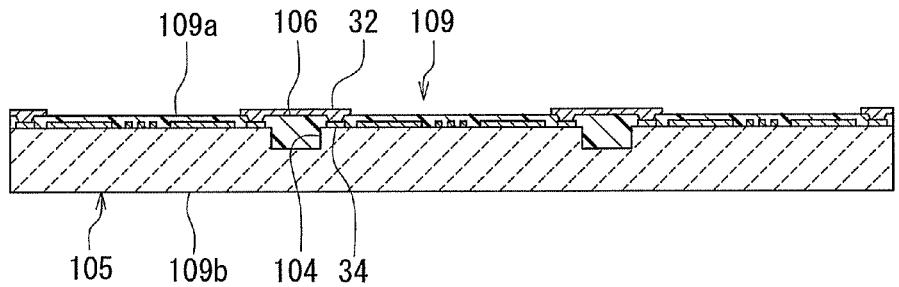
FIG. 9 is a cross-sectional view showing a part of a pre-polishing substructure fabricated in a step that follows the step of FIG. 8.
Figure 13:
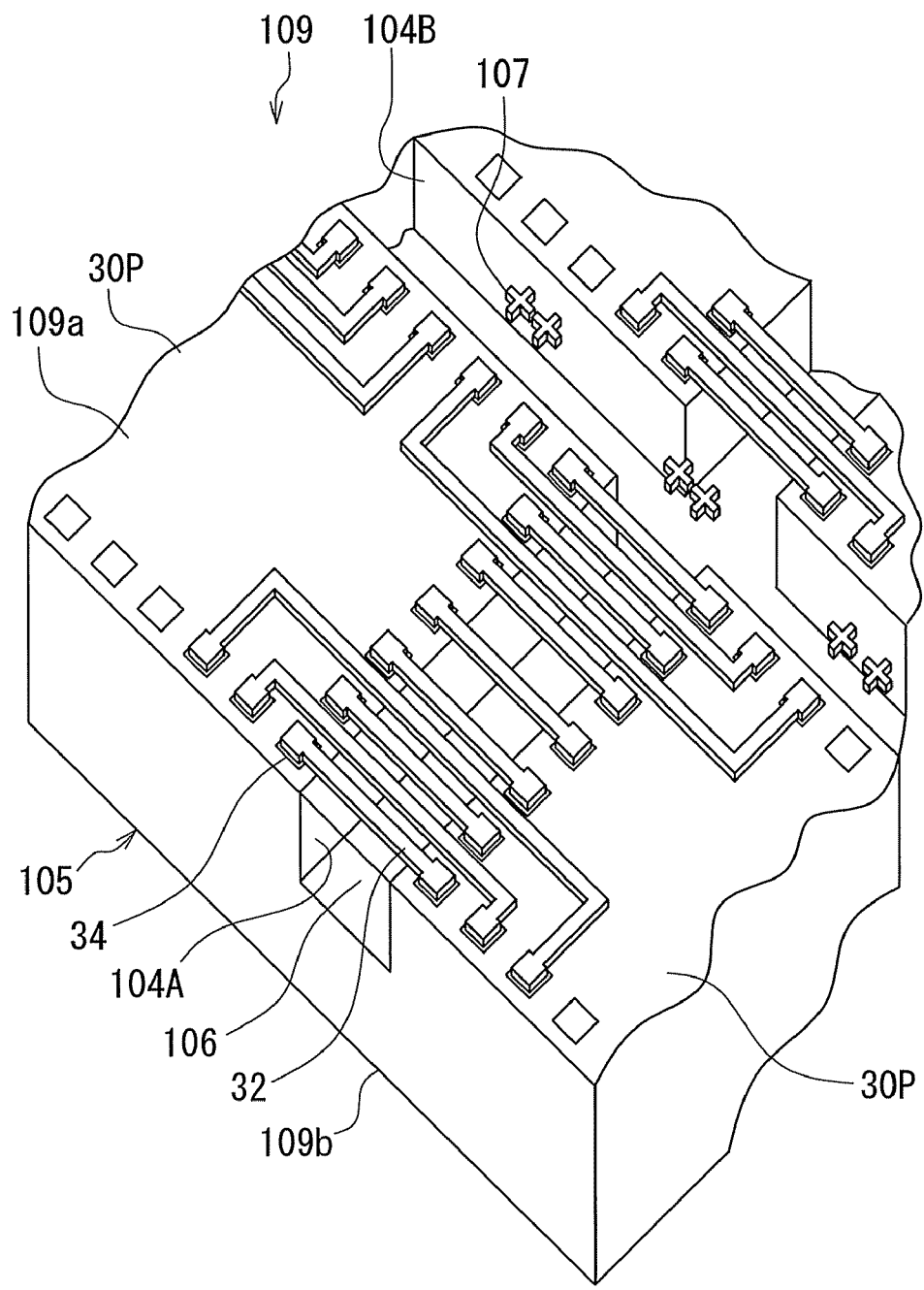
FIG. 13 is a perspective view showing a part of the pre-polishing substructure fabricated in the step of FIG. 9.

FIG. 9 shows a step that follows the step of FIG. 8. In this step, the plurality of electrodes 32 are formed such that part of each of the electrodes 32 lies on the insulating layer 106. The electrodes 32 are connected to the terminals 34 through the openings 106a. FIG. 13 shows a part of a pre-polishing substructure fabricated in the step of FIG. 9. FIG. 9 and FIG. 13 show an example where the electrodes 32 extending from one of two adjacent pre-semiconductor-chip portions 30P and the electrodes 32 extending from the other of the two adjacent pre-semiconductor chip portions 30P are joined to each other. However, the electrodes 32 extending from one of two adjacent pre-semiconductor-chip portions 30P and the electrodes 32 extending from the other of the two adjacent pre-semiconductor chip portions 30P need not be joined to each other.

The electrodes 32 are formed of a conductive material such as Cu. The electrodes 32 are formed by frame plating, for example. In this case, a seed layer for plating is initially formed on the insulating layer 106. Next, a frame having grooves is formed on the seed layer. The frame is formed by patterning a photoresist layer by photolithography, for example. Next, plating layers to become part of the electrodes 32 are formed by plating on the seed layer in the grooves of the frame. Next, the frame is removed and the seed layer except portions thereof located under the plating layers is also removed by etching. As a result, the electrodes 32 are formed of the plating layers and the portions of the seed layer remaining under the plating layers.

As shown in FIG. 13, in the step of forming the plurality of electrodes 32, a plurality of alignment marks 107 are formed on the insulating layer 106 simultaneously with the formation of the plurality of electrodes 32. The alignment marks 107 are provided above the grooves 104. The material and forming method of the alignment marks 107 are the same as those of the electrodes 32.

The pre-polishing substructure 109 shown in FIG. 9 and FIG. 13 is thus fabricated. The pre-polishing substructure 109 includes: the pre-polishing substructure main body 105 including an array of a plurality of pre-semiconductor-chip portions 30P; the insulating layer 106 that fills the grooves 104 of the pre-polishing substructure main body 105 and that is to become part of the insulating portion 31 later; the plurality of electrodes 32 each having a portion lying on the insulating layer 106; and the plurality of alignment marks 107 provided on the insulating layer 106. The pre-polishing substructure 109 has a first surface 109a and a second surface 109b. The first surface 109a corresponds to the first surface 100a of the semiconductor wafer 100 and the first surface 101a of the pre-substructure wafer 101. The second surface 109b corresponds to the second surface 100b of the semiconductor wafer 100 and the second surface 101b of the pre-substructure wafer 101. The pre-polishing substructure 109 has a thickness of 1.2 mm or so, for example.

In the present embodiment, one or more sets of first to fourth pre-polishing substructures 109 are fabricated. Each of the first to fourth pre-polishing substructures 109 is fabricated through the steps that have been described with reference to FIG. 7 to FIG. 9, by using the pre-substructure wafer 101 shown in FIG. 6.

Figure 10:
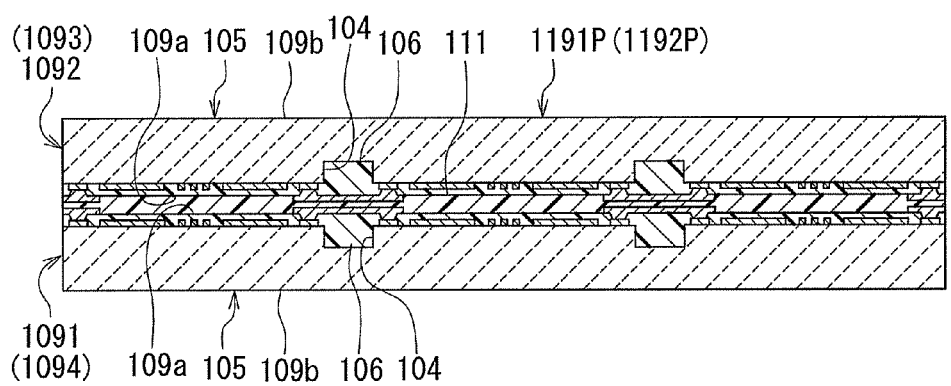
FIG. 10 is a cross-sectional view showing a part of a pre-polishing stack formed in a step that follows the step of FIG. 9.

FIG. 10 shows a step that follows the step of FIG. 9. In this step, two pre-polishing substructures 109 are bonded to each other with an insulating adhesive such that their respective first surfaces 109a face each other. A pre-polishing stack including the two pre-polishing substructures 109 is thereby fabricated. An insulating layer 111 formed by the adhesive covers the electrodes 32 and will become part of the insulating portion 31. The insulating layer 111 is preferably transparent. Here, as shown in FIG. 10, the lower one of the two pre-polishing substructures 109 will be referred to as a first pre-polishing substructure, and will be designated by reference numeral 1091. The upper one of the two pre-polishing substructures 109 will be referred to as a second pre-polishing substructure, and will be designated by reference numeral 1092. The pre-polishing stack formed by bonding the first pre-polishing substructure 1091 and the second pre-polishing substructure 1092 to each other will be referred to as a first pre-polishing stack, and will be designated by reference numeral 1191P.

Figure 11:
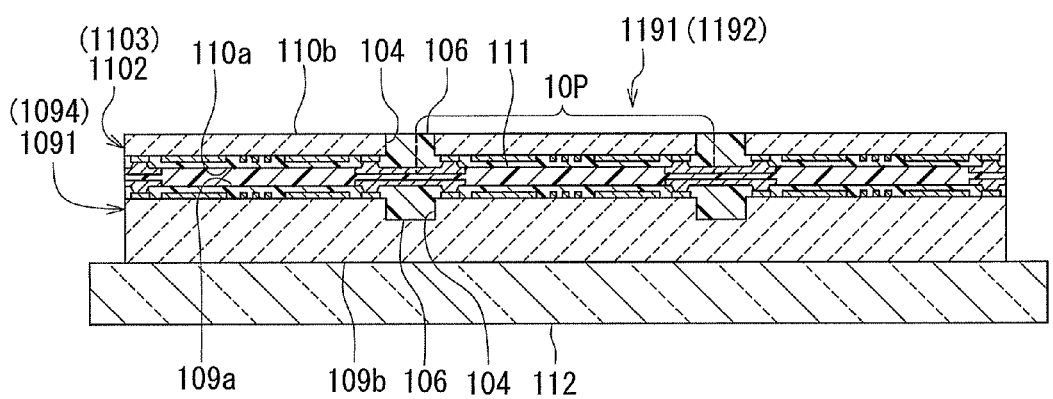
FIG. 11 is a cross-sectional view showing a part of a stack formed in a step that follows the step of FIG. 10

FIG. 11 shows a step that follows the step of FIG. 10. In this step, the second surface 109b of the second pre-polishing substructure 1092 of the first pre-polishing stack 1191P is polished. This polishing is performed until the plurality of grooves 104 are exposed. The second pre-polishing substructure 1092 is thus thinned by the polishing into a second substructure 1102, whereby a first stack 1191 including the first pre-polishing substructure 1091 and the second substructure 1102 is formed. The second substructure 1102 includes an array of a plurality of layer portions 10P, each of the plurality of layer portions 10P being intended to become any one of the layer portions 10 included in the main body 2. The second substructure 1102 is to be cut later at the position of the boundary between every adjacent preliminary layer portions 10P. The second substructure 1102 has a thickness of 30 to 100 μm, for example. The second substructure 1102 has a first surface 110a corresponding to the first surface 109a of the pre-polishing substructure 1092, and a second surface 110b opposite to the first surface 110a. The second surface 110b is the polished surface. The other substructures to be subsequently formed each have the same configuration and thickness as those of the second substructure 1102. Hereinafter, any substructure will be generally designated by reference numeral 110.

The step of polishing the second surface 109b of the second pre-polishing substructure 1092 of the first pre-polishing stack 1191P is performed, for example, in such a state that a plate-shaped jig 112 is bonded onto the second surface 109b of the first pre-polishing substructure 1091 as shown in FIG. 11. This facilitates handling of the stack 1191 and prevents the stack 1191 from being damaged in a subsequent step.

Figure 14:
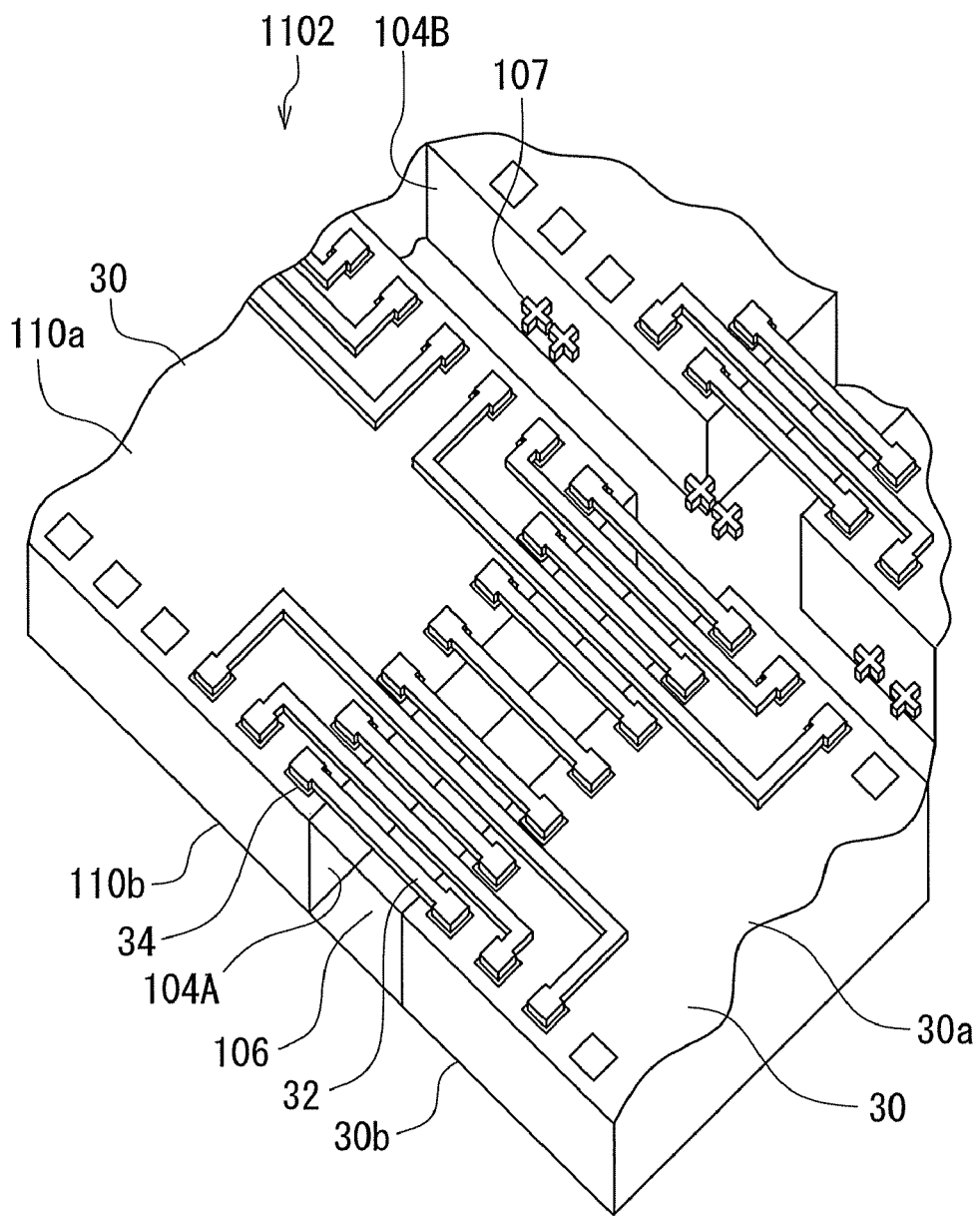
FIG. 14 is a perspective view showing a part of a substructure formed in the step of FIG. 11.

FIG. 14 shows a part of the second substructure 1102 fabricated in the step of FIG. 11. As previously described, the second surface 109b of the second pre-polishing substructure 1092 is polished until the plurality of grooves 104 are exposed. This separates the plurality of pre-semiconductor-chip portions 30P from each other into individual semiconductor chips 30. The first surface 30a of each semiconductor chip 30 corresponds to the first surface 100a of the semiconductor wafer 100, and the second surface 30b of each semiconductor chip 30 corresponds to the second surface 100b of the semiconductor wafer 100. The plurality of terminals 34 of each semiconductor chip 30 are located on the first surface 30a.

In the step of fabricating the layered substructure, a second stack 1192 having the same configuration as that of the first stack 1191 is formed. As is the first stack 1191, the second stack 1192 is formed through the steps shown in FIG. 10 and FIG. 11 in the following way. First, two pre-polishing substructures 109 are bonded to each other such that their respective first surfaces 109a face each other, whereby a pre-polishing stack including the two pre-polishing substructures 109 is formed. Here, as shown in FIG. 10, the lower one of the two pre-polishing substructures 109 will be referred to as a fourth pre-polishing substructure, and will be designated by reference numeral 1094. The upper one of the two pre-polishing substructures 109 will be referred to as a third pre-polishing substructure, and will be designated by reference numeral 1093. The pre-polishing stack formed by bonding the third pre-polishing substructure 1093 and the fourth pre-polishing substructure 1094 to each other will be referred to as a second pre-polishing stack, and will be designated by reference numeral 1192P.

Next, the second surface 109b of the third pre-polishing substructure 1093 of the second pre-polishing stack 1192P is polished. This polishing is performed until the plurality of grooves 104 are exposed. The third pre-polishing substructure 1093 is thus thinned by the polishing into a third substructure 1103, whereby the second stack 1192 including the third substructure 1103 and the fourth pre-polishing substructure 1094 is formed. The third substructure 1103 has a first surface 110a corresponding to the first surface 109a of the pre-polishing substructure 1093, and a second surface 110b opposite to the first surface 110a. The second surface 110b is the polished surface.

Figure 15:
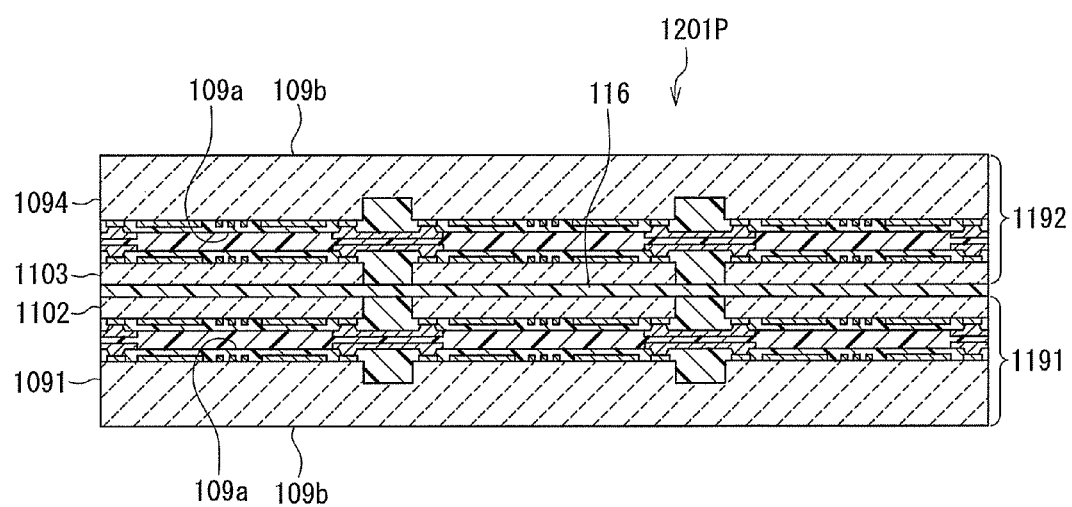
FIG. 15 is a cross-sectional view showing a part of a third pre-polishing stack formed in a step that follows the step of FIG. 11.

FIG. 15 shows a step that follows the step of FIG. 11, that is, the step after the formation of the first stack 1191 and the second stack 1192. In this step, the first stack 1191 and the second stack 1192 are bonded to each other with an adhesive such that the second substructure 1102 and the third substructure 1103 face each other, whereby a third pre-polishing stack 1201P is formed. Reference numeral 116 in FIG. 15 indicates an adhesive layer formed by the adhesive.

Figure 16:
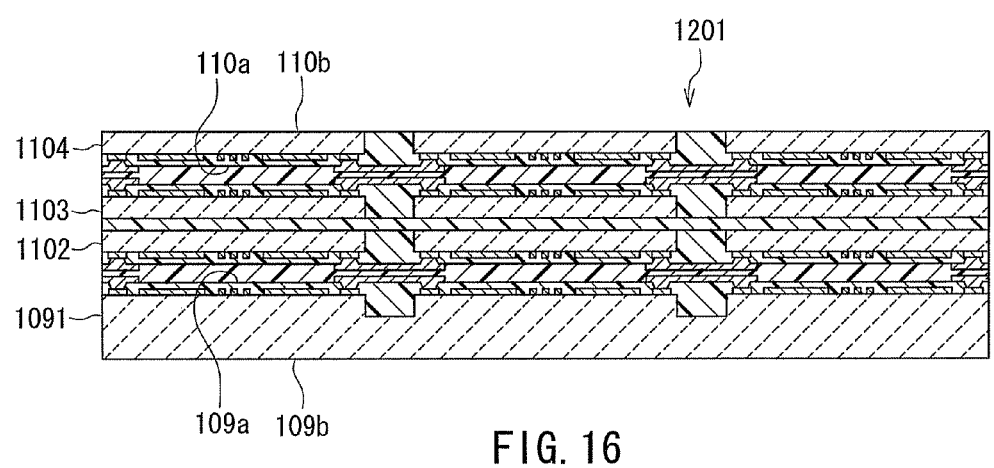
FIG. 16 is a cross-sectional view showing a part of a third stack formed in a step that follows the step of FIG. 15.

FIG. 16 shows a step that follows the step of FIG. 15. In this step, the second surface 109b of the fourth pre-polishing substructure 1094 of the third pre-polishing stack 1201P is polished. This polishing is performed until the plurality of grooves 104 are exposed. The fourth pre-polishing substructure 1094 is thus thinned by the polishing into a fourth substructure 1104, and the third pre-polishing stack 1201P is thereby made into a third stack 1201. Although not shown in the drawings, the step of polishing the second surface 109b of the fourth pre-polishing substructure 1094 is performed, for example, in such a state that a plate-shaped jig is bonded onto the second surface 109b of the first pre-polishing substructure 1091. The fourth substructure 1104 has a first surface 110a corresponding to the first surface 109a of the pre-polishing substructure 1094, and a second surface 110b opposite to the first surface 110a. The second surface 110b is the polished surface. The third stack 1201 includes the first pre-polishing structure 1091, the second substructure 1102, the third substructure 1103, and the fourth substructure 1104 that are stacked.

Figure 17:
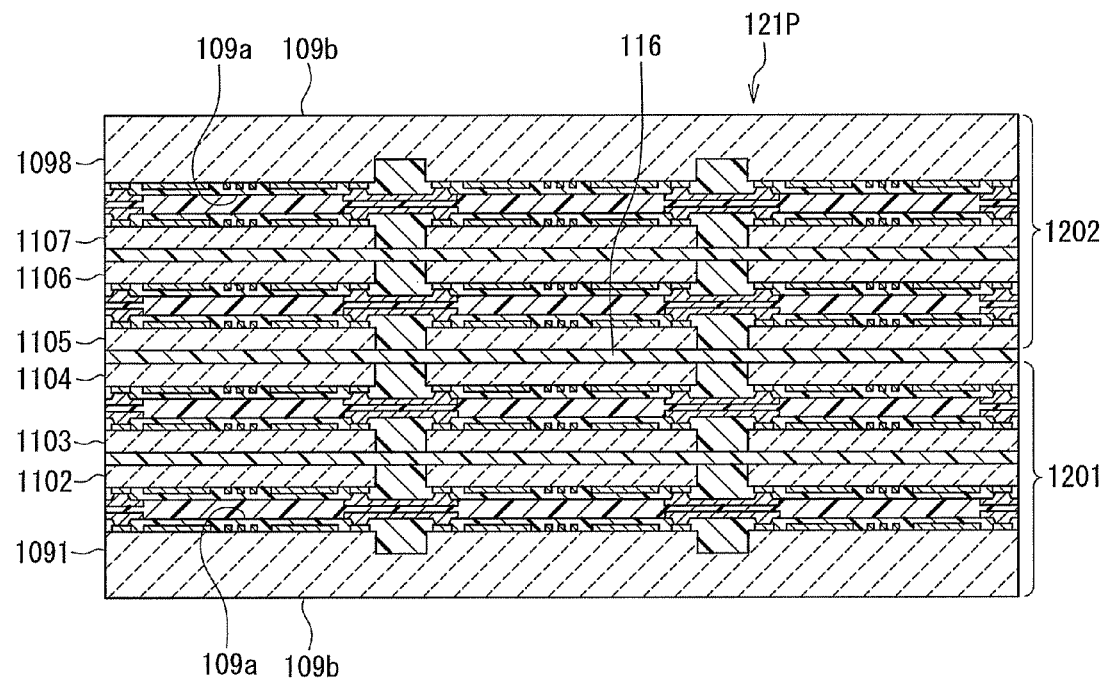
FIG. 17 is a cross-sectional view showing a part of a fourth pre-polishing stack formed in a step that follows the step of FIG. 16.

In the step of fabricating the layered substructure, another third stack 1202 having the same configuration as that of the third stack 1201 shown in FIG. 16 is formed as shown in FIG. 17. As is the third stack 1201, the third stack 1202 is formed through the series of steps that have been described with reference to FIG. 5 to FIG. 16. The third stack 1202 includes a first pre-polishing substructure 1098, a second substructure 1107, a third substructure 1106, and a fourth substructure 1105 that are stacked.

FIG. 17 shows a step that follows the step of FIG. 16, that is, the step after the formation of the two third stacks 1201 and 1202. In this step, the two third stacks 1201 and 1202 are bonded to each other with an adhesive such that the respective fourth substructures 1104 and 1105 face each other, whereby a fourth pre-polishing stack 121P is formed. Reference numeral 116 in FIG. 17 indicates an adhesive layer formed by the adhesive. The fourth pre-polishing stack 121P includes two sets of the first pre-polishing substructure, the second substructure, the third substructure, and the fourth substructure that are stacked.

Figure 18:
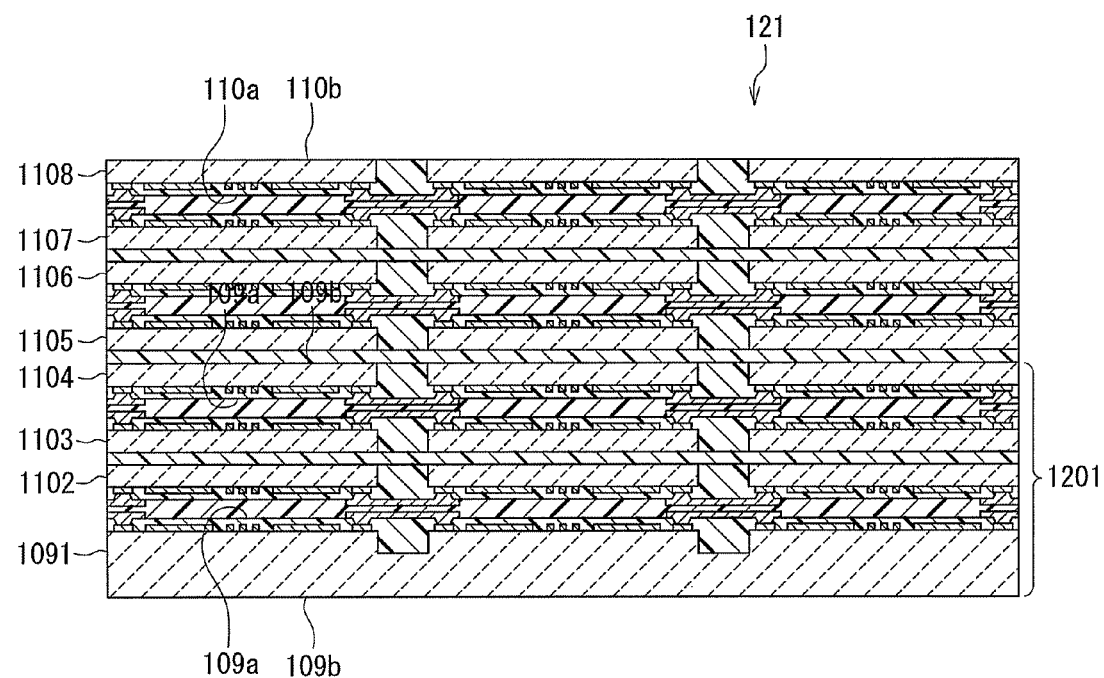
FIG. 18 is a cross-sectional view showing a part of a fourth stack formed in a step that follows the step of FIG. 17.

FIG. 18 shows a step that follows the step of FIG. 17. In this step, the second surface 109b of the first pre-polishing substructure 1098 of the third stack 1202 included in the fourth pre-polishing stack 121P shown in FIG. 17 is polished. This polishing is performed until the plurality of grooves 104 are exposed. The first pre-polishing substructure 1098 is thus thinned by the polishing into a first substructure 1108, and the fourth pre-polishing stack 121P is thereby made into a fourth stack 121. Although not shown in the drawings, the step of polishing the second surface 109b of the first pre-polishing substructure 1098 of the stack 1202 is performed, for example, in such a state that a plate-shaped jig is bonded onto the second surface 109b of the first pre-polishing substructure 1091 of the stack 1201. The first substructure 1108 has a first surface 110a corresponding to the first surface 109a of the pre-polishing substructure 1098, and a second surface 110b opposite to the first surface 110a. The second surface 110b is the polished surface.

Figure 19:
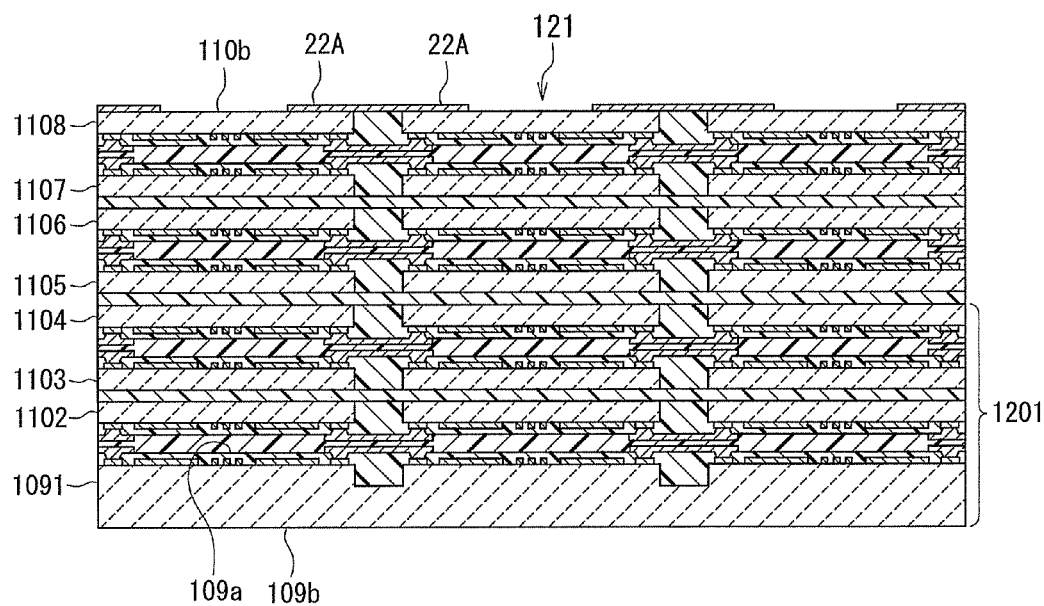
FIG. 19 is a cross-sectional view showing a part of a structure formed in a step that follows the step of FIG. 18.

FIG. 19 shows a step that follows the step of FIG. 18. In this step, a plurality of terminals 22A corresponding to a plurality of main bodies 2 are simultaneously formed on the second surface 110b of the substructure 1108 of the fourth stack 121 shown in FIG. 18 by plating, for example. Note that FIG. 19 shows a case where a plurality of terminals 22A corresponding to two main bodies 2 are joined to each other across the border between two adjacent portions to become the two main bodies 2. However, the plurality of terminals 22A corresponding to two main bodies 2 need not be joined to each other. Alignment marks may be formed on the second surface 110b of the substructure 1108 at the border positions between two adjacent portions to become two main bodies 2. The alignment marks may be made of the same material as that of the plurality of terminals 22A, and may be formed simultaneously with the plurality of terminals 22A.

Figure 20:
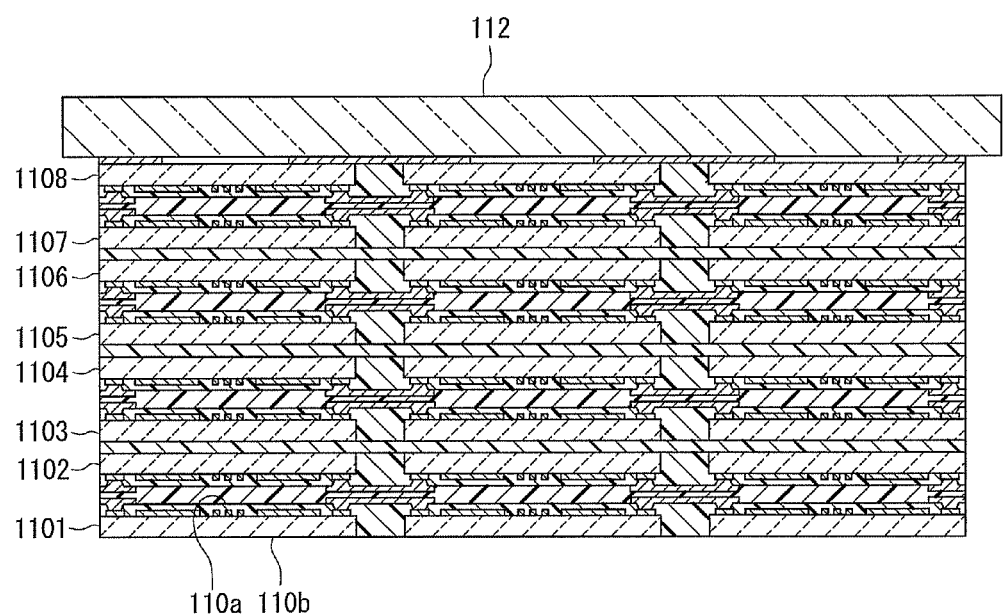
FIG. 20 is a cross-sectional view showing a part of a structure formed in a step that follows the step of FIG. 19.

FIG. 20 shows a step that follows the step of FIG. 19. In this step, the second surface 109b of the first pre-polishing substructure 1091 of the third stack 1201 included in the fourth stack 121 shown in FIG. 19 is polished. This polishing is performed, for example, in such a state that the plate-shaped jig 112 is bonded onto the second surface 110b of the substructure 1108 with the terminals 22A formed thereon. This polishing is performed until the plurality of grooves 104 are exposed. The first pre-polishing substructure 1091 is thus thinned by the polishing into a first substructure 1101. The first substructure 1101 has a first surface 110a corresponding to the first surface 109a of the pre-polishing substructure 1091, and a second surface 110b opposite to the first surface 110a. The second surface 110b is the polished surface.

Figure 21:
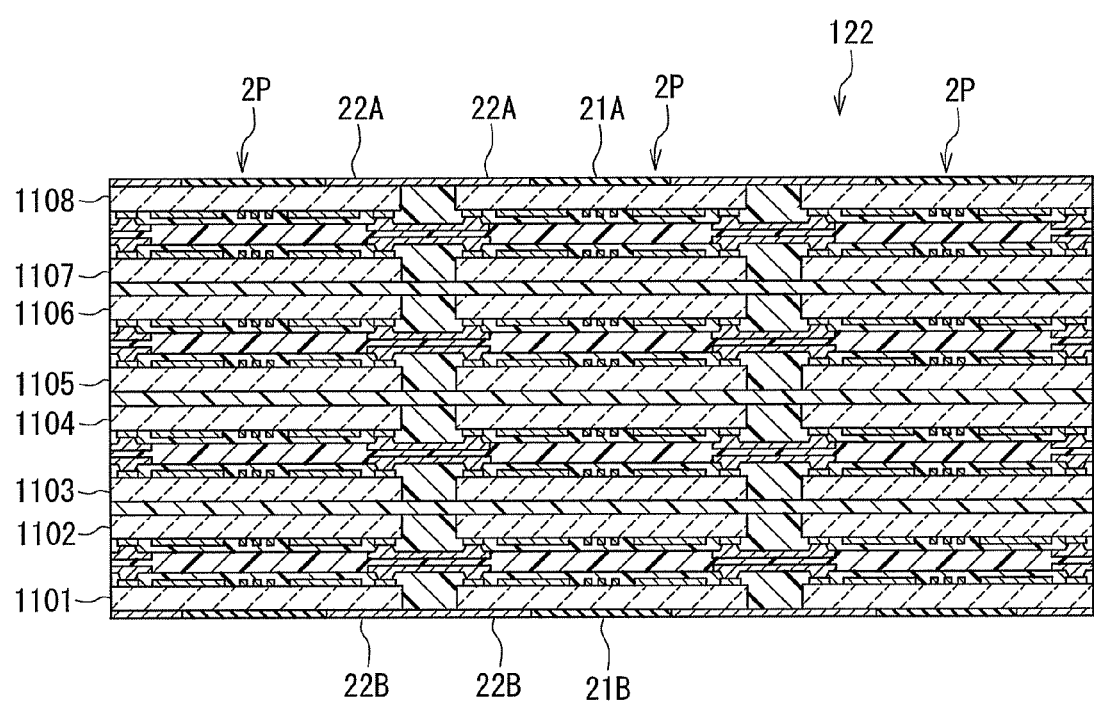
FIG. 21 is a cross-sectional view showing a part of a layered substructure formed in a step that follows the step of FIG. 20.

FIG. 21 shows a step that follows the step of FIG. 20. In this step, a plurality of terminals 22B corresponding to a plurality of main bodies 2 are simultaneously formed on the second surface 110b of the substructure 1101 shown in FIG. 20 by plating, for example. Note that FIG. 21 shows a case where a plurality of terminals 22B corresponding to two main bodies 2 are joined to each other across the border between two adjacent portions to become the two main bodies 2. However, the plurality of terminals 22B corresponding to two main bodies 2 need not be joined to each other. Alignment marks may be formed on the second surface 110b of the substructure 1101 at the border positions between two adjacent portions to become two main bodies 2. The alignment marks may be made of the same material as that of the plurality of terminals 22B, and may be formed simultaneously with the plurality of terminals 22B. Next, the insulating layer 21A is formed on the second surface 110b of the substructure 1108 so as to surround the plurality of terminals 22A, and the insulating layer 21B is formed on the second surface 110b of the substructure 1101 so as to surround the plurality of terminals 22B.

Figure 22:
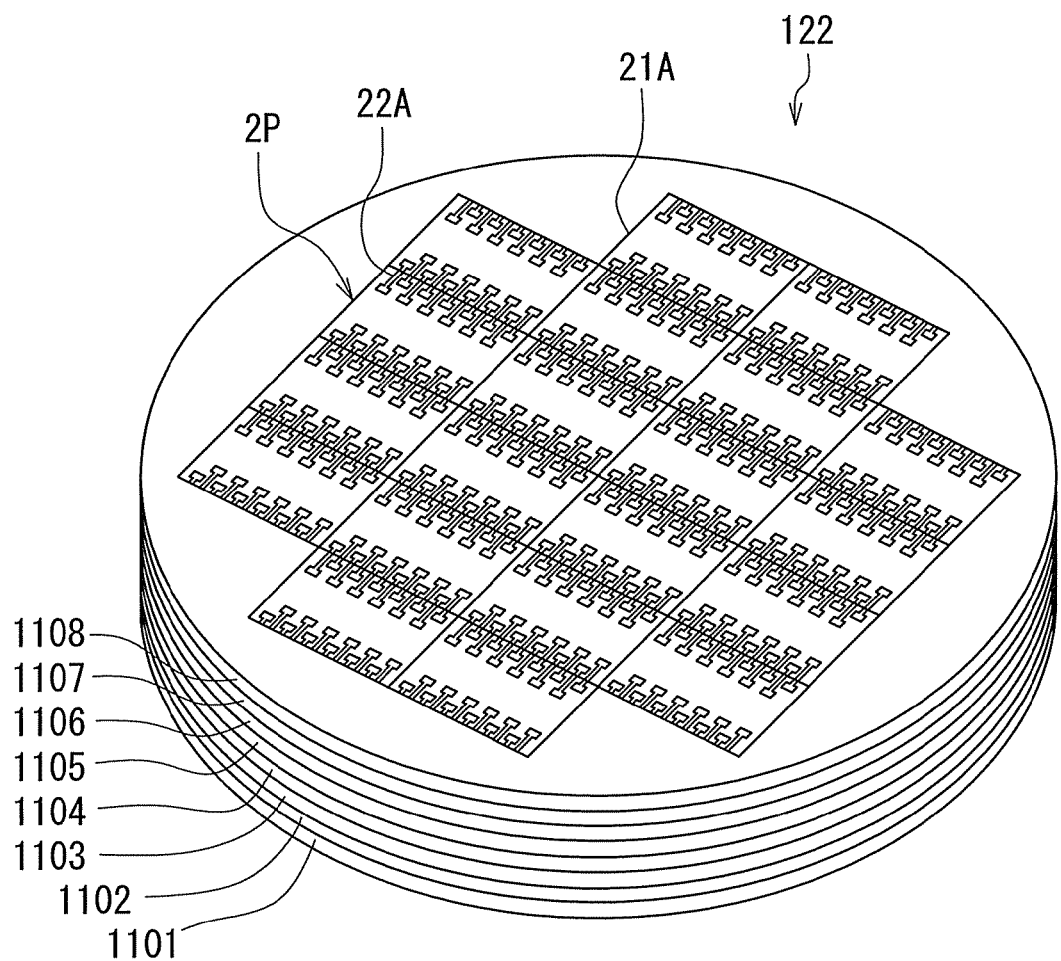
FIG. 22 is a perspective view of the layered substructure formed in the step that follows the step of FIG. 20.

A layered substructure 122 shown in FIG. 21 and FIG. 22 is thus completed. The layered substructure 122 includes one or more sets of the first to fourth substructures stacked. The layered substructure 122 of the example shown in FIG. 21 and FIG. 22 includes two sets of the first to fourth substructures stacked. One of the two sets consists of a stack of the first substructure 1101, the second substructure 1102, the third substructure 1103, and the fourth substructure 1104. The other of the two sets consists of a stack of the first substructure 1108, the second substructure 1107, the third substructure 1106, and the fourth substructure 1105.

The layered substructure 122 also includes an array of a plurality of pre-separation main bodies 2P that are to be separated from each other later into individual main bodies 2. In the example shown in FIG. 21 and FIG. 22, each pre-separation main body 2P includes eight preliminary layer portions 10P.

In the layered substructure 122, the first substructure 1101 and the second substructure 1102 are bonded to each other such that their respective first surfaces 110a face each other. Similarly, a pair of the third substructure 1103 and the fourth substructure 1104, a pair of the first substructure 1108 and the second substructure 1107, and a pair of the third substructure 1106 and the fourth substructure 1105 are each bonded together such that the respective first surfaces 110a of the pair face each other.

Figure 23:
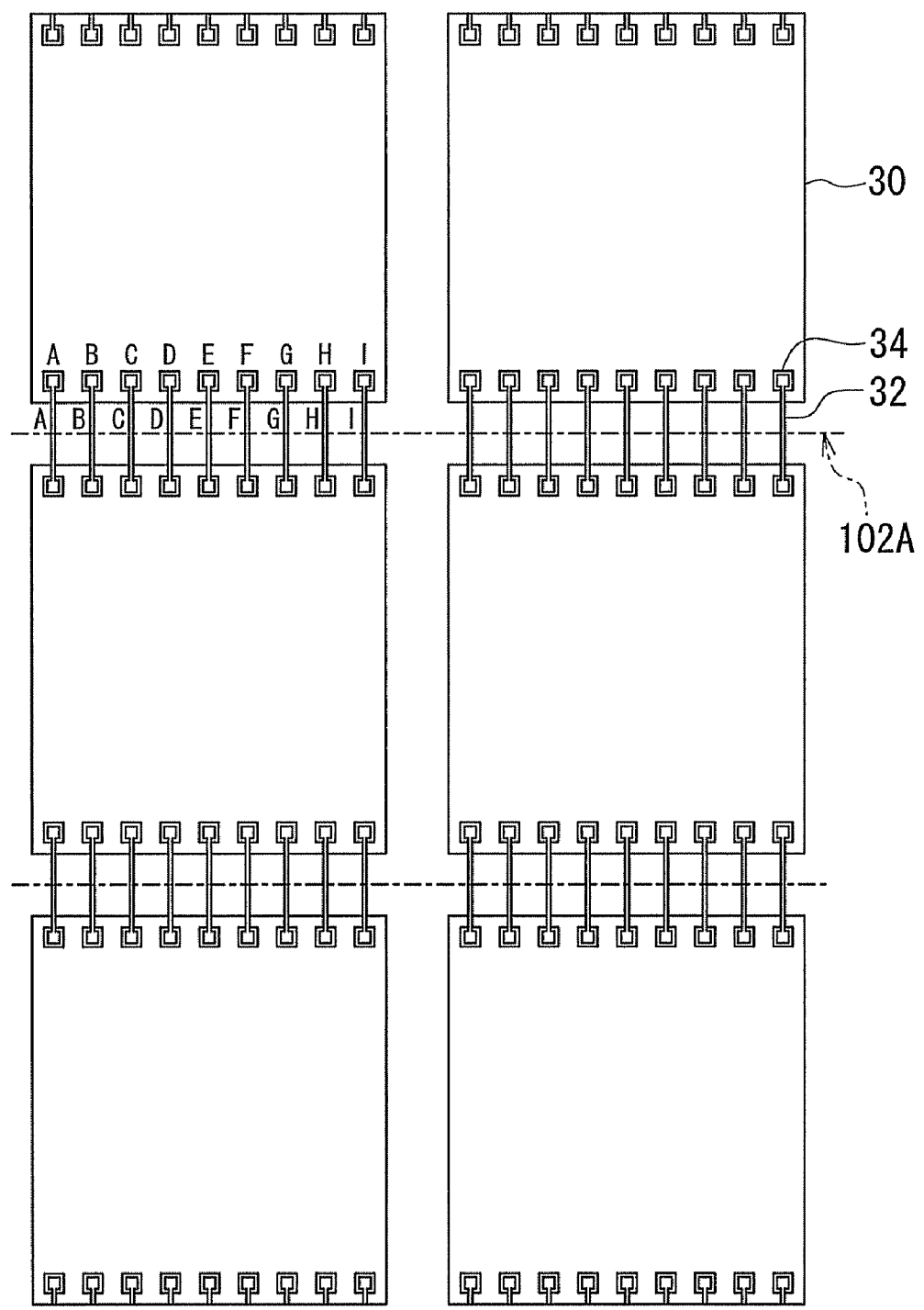
FIG. 23 is a plan view showing an example of arrangement of a plurality of terminals and a plurality of electrodes in a first substructure.
Figure 24:
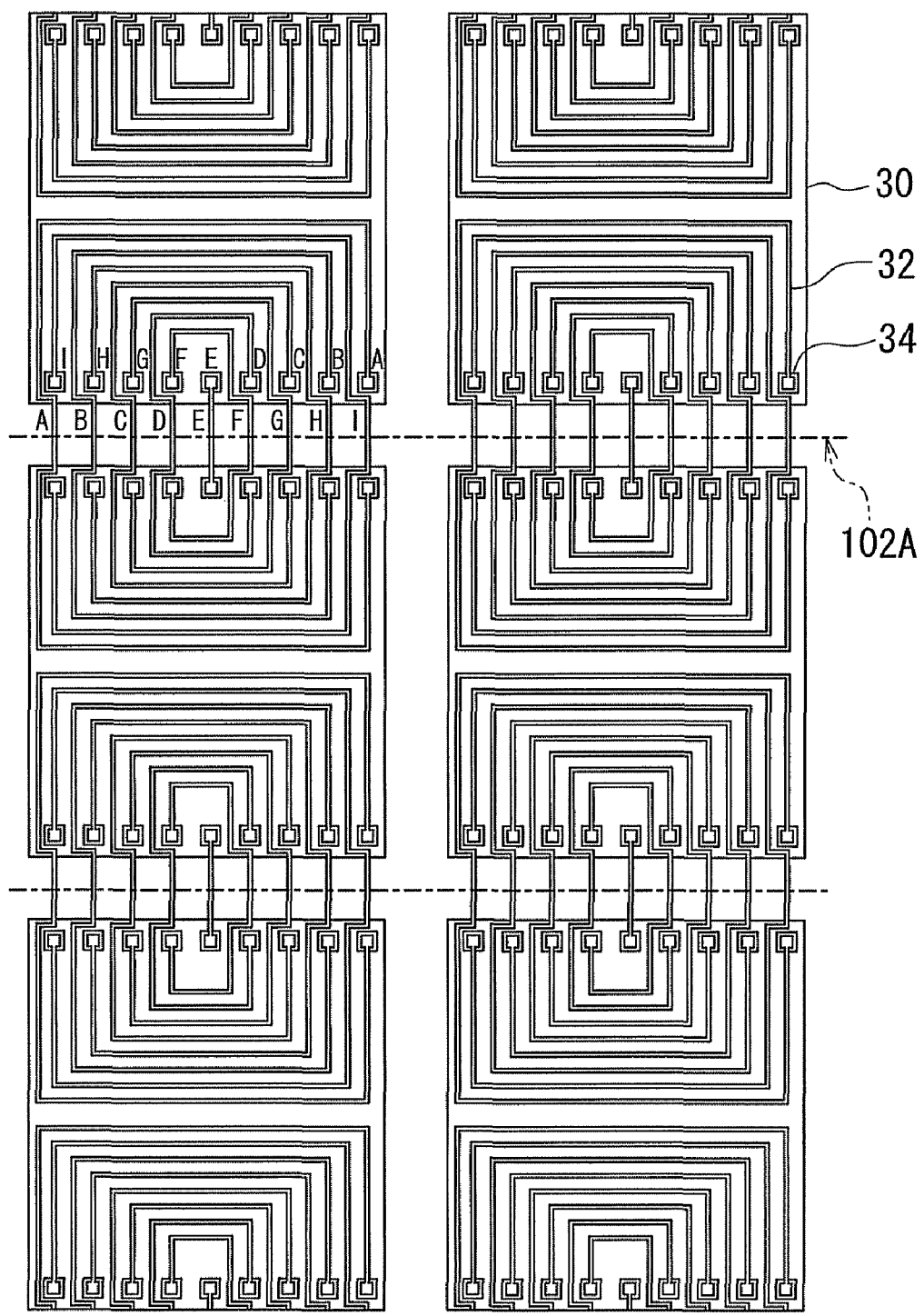
FIG. 24 is a plan view showing an example of arrangement of a plurality of terminals and a plurality of electrodes in a second substructure.

Referring to FIG. 23 and FIG. 24, a description will now be given of an example of arrangement of the terminals 34 and the electrodes 32 in the two substructures 1101 and 1102 that are bonded to each other such that their respective first surfaces 110a face each other. It should be noted that the following description also applies to the pair of the substructures 1103 and 1104, the pair of the substructures 1108 and 1107, and the pair of the substructures 1106 and 1105.

FIG. 23 shows the terminals 34 and the electrodes 32 of the first substructure 1101 as viewed from the first surface 110a of the first substructure 1101. FIG. 24 shows the terminals 34 and the electrodes 32 of the second substructure 1102 as viewed from the second surface 110b of the second substructure 1102. The substructures 1101 and 1102 are to be cut later along the scribe lines 102A shown in FIG. 23 and FIG. 24.

This cutting produces the respective end faces of the electrodes 32 located in one of the side surfaces of the main body 2.

Each of the semiconductor chips 30 included in the first substructure 1101 shown in FIG. 23 will hereinafter be referred to as a first semiconductor chip 30. Each of the semiconductor chips 30 included in the second substructure 1102 shown in FIG. 24 will hereinafter be referred to as a second semiconductor chip 30.

As shown in FIG. 23, the first semiconductor chip 30 has a plurality of first terminals 34 that are arranged in a predetermined order. Of the plurality of first terminals 34, attention is here focused on nine terminals that are arranged along one side of the first surface 30a of the semiconductor chip 30, as shown in FIG. 23. In FIG. 23, the nine terminals are indicated with reference characters A to I. In the first semiconductor chip 30, the terminals A to I are arranged in a row in the order of A to I in the direction from left to right in FIG. 23.

The second semiconductor chip 30 shown in FIG. 24 has a plurality of second terminals 34 that are arranged in a predetermined order in correspondence with the first terminals 34 of the first semiconductor chip 30 of FIG. 23. In particular, the second semiconductor chip 30 has terminals A to I that respectively correspond to the terminals A to I of the first semiconductor chip 30 and that are arranged similarly to the terminals A to I of the first semiconductor chip 30. When viewed from the first surface 30a of the semiconductor chip 30, the terminals A to I of the first semiconductor chip 30 and the terminals A to I of the second semiconductor chip 30 are arranged in the same order. In such a state that the first and second semiconductor chips 30 are arranged with their first surfaces 30a facing each other, however, the order of arrangement of the terminals A to I of the second semiconductor chip 30 is the reverse of that of the terminals A to I of the first semiconductor chip 30 when viewed in one direction, such as the direction from the second surface 30b of the second semiconductor chip 30, as shown in FIG. 23 and FIG. 24.

Here, with regard to the end faces of the plurality of electrodes 32 to be formed later in the positions of the scribe lines 102A shown in FIG. 23 and FIG. 24, the end faces corresponding to the terminals A to I of the semiconductor chips 30 are also indicated with reference characters A to I. In the first substructure 1101, when viewed in one direction, the end faces A to I of the electrodes 32 to be formed in the positions of the scribe lines 102A are arranged in the same order as the order of arrangement of the corresponding terminals A to I, as shown in FIG. 23. In other words, the plurality of electrodes 32 of the first substructure 1101 are formed in such a pattern that the order of arrangement of the end faces A to I of the electrodes 32 is the same as that of the corresponding terminals A to I.

In contrast, in the second substructure 1102, when viewed in one direction, the end faces A to I of the electrodes 32 to be formed in the positions of the scribe lines 102A are arranged in the reverse order to the order of arrangement of the corresponding terminals A to I, as shown in FIG. 24. In other words, the plurality of electrodes 32 of the second substructure 1102 are formed in such a pattern that the order of arrangement of the end faces A to I of the electrodes 32 is the reverse of the order of arrangement of the corresponding terminals A to I.

In the layered chip package 1 fabricated by using the layered substructure 122 including the first and second substructures 1101 and 1102 shown in FIG. 23 and FIG. 24, when viewed in one direction, the order of arrangement of the terminals A to I of the second semiconductor chip 30 is the reverse of that of the terminals A to I of the first semiconductor chip 30. The end faces of the electrodes 32 that are located in one side surface of the main body 2 and connected to the terminals A to I of the first semiconductor chip 30 are arranged in the same order as the order of arrangement of the corresponding terminals A to I, whereas the end faces of the electrodes 32 that are located in one side surface of the main body 2 and connected to the terminals A to I of the second semiconductor chip 30 are arranged in the reverse order to the order of arrangement of the corresponding terminals A to I. Consequently, in one side surface of the main body 2, the end faces of the electrodes 32 that are connected to the terminals A to I of the first semiconductor chip 30 and the end faces of the electrodes 32 that are connected to the terminals A to I of the second semiconductor chip 30 are arranged in the same order.

Here, consideration is given to a case where, in a pair of layer portions included in the layered chip package 1, the first and second semiconductor chips 30 having the plurality of terminals 34 arranged in the same manner are configured so that the respective first surfaces 30a face each other and the corresponding terminals 34 of the first and second semiconductor chips 30 are connected to each other. In such a case, according to the example of arrangement of the terminals 34 and the electrodes 32 of the first and second substructures 110₁ and 110₂ shown in FIG. 23 and FIG. 24, the end faces of the electrodes 32 that are connected to the terminals 34 of the first semiconductor chip 30 and the end faces of the electrodes 32 that are connected to the terminals 34 of the second semiconductor chip 30 are arranged in the same order in one side surface of the main body 2. This makes it possible to easily connect the corresponding terminals 34 of the first and second semiconductor chips 30 to each other through the wiring 3.

While the foregoing description has been made concerning the terminals 34 that are arranged along one side of the first surface 30a of the semiconductor chip 30 shown in each of FIG. 23 and FIG. 24 and the electrodes 32 connected to those terminals 34, the same description applies to other terminals 34 that are arranged along the opposite side to the foregoing side and the electrodes 32 connected to those terminals 34.

Figure 25:
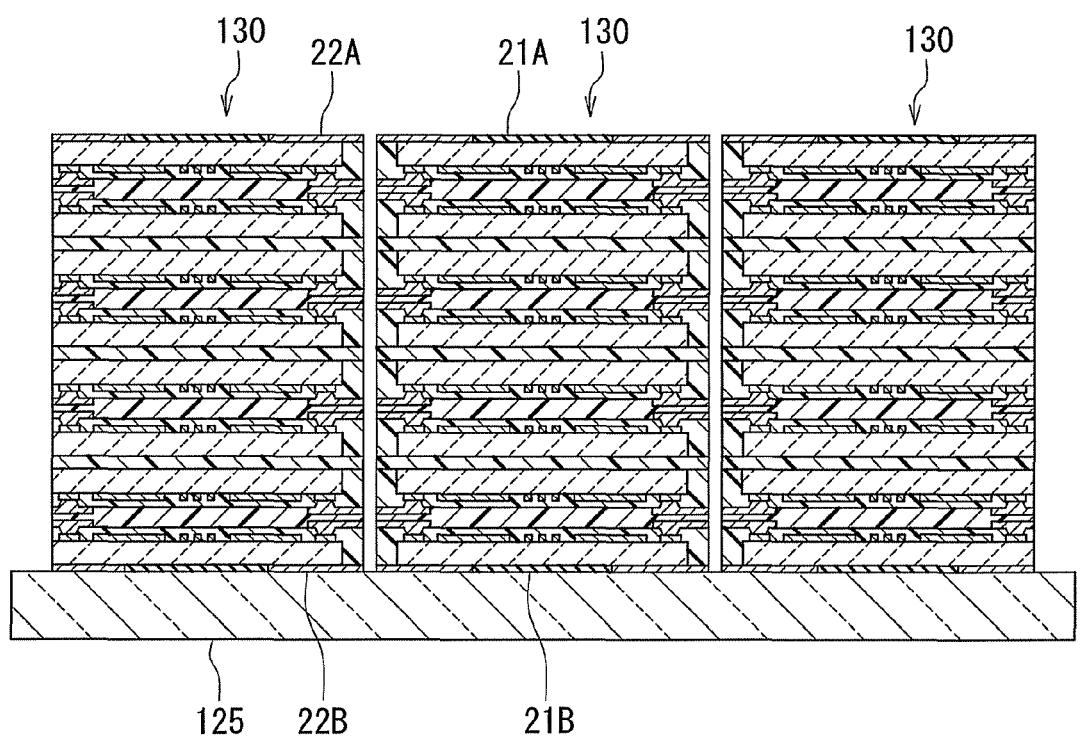
FIG. 25 is a cross-sectional view showing a part of a block formed in a step that follows the step of FIG. 21.
Figure 26:
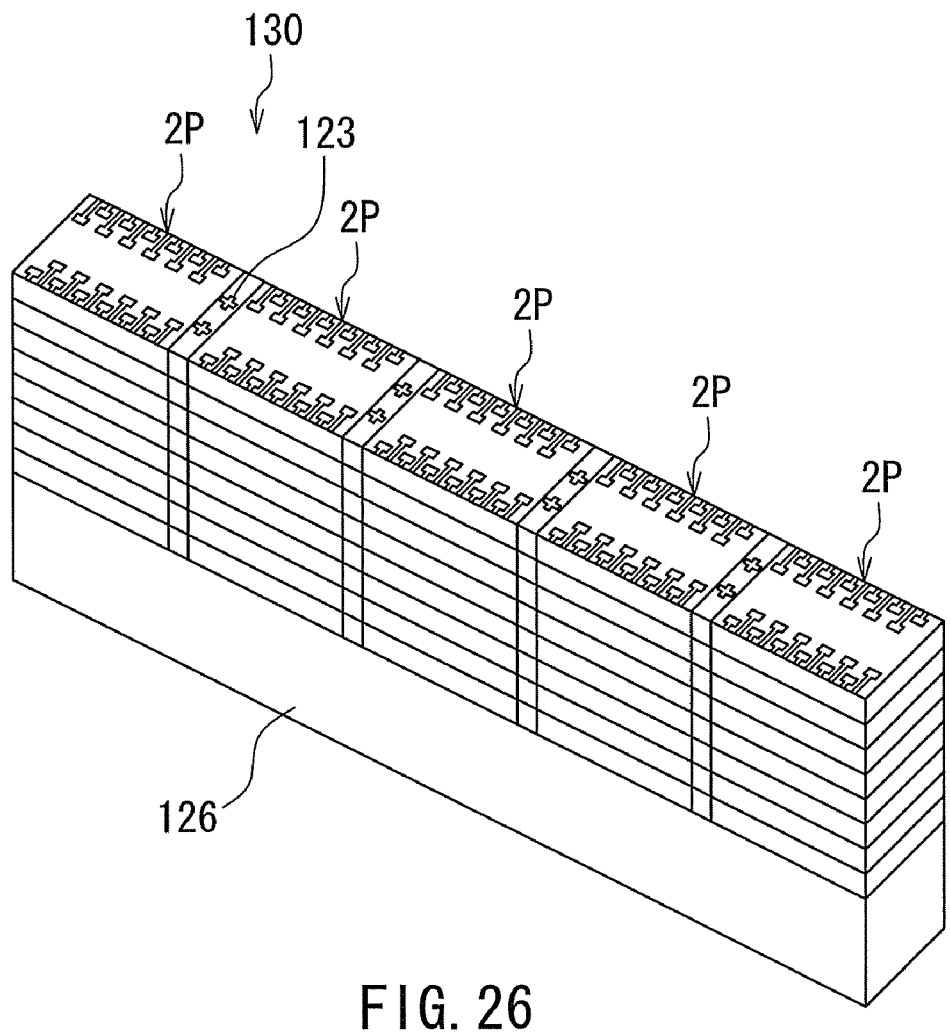
FIG. 26 is a perspective view showing an example of the block formed in the step of FIG. 25.
Figure 27:
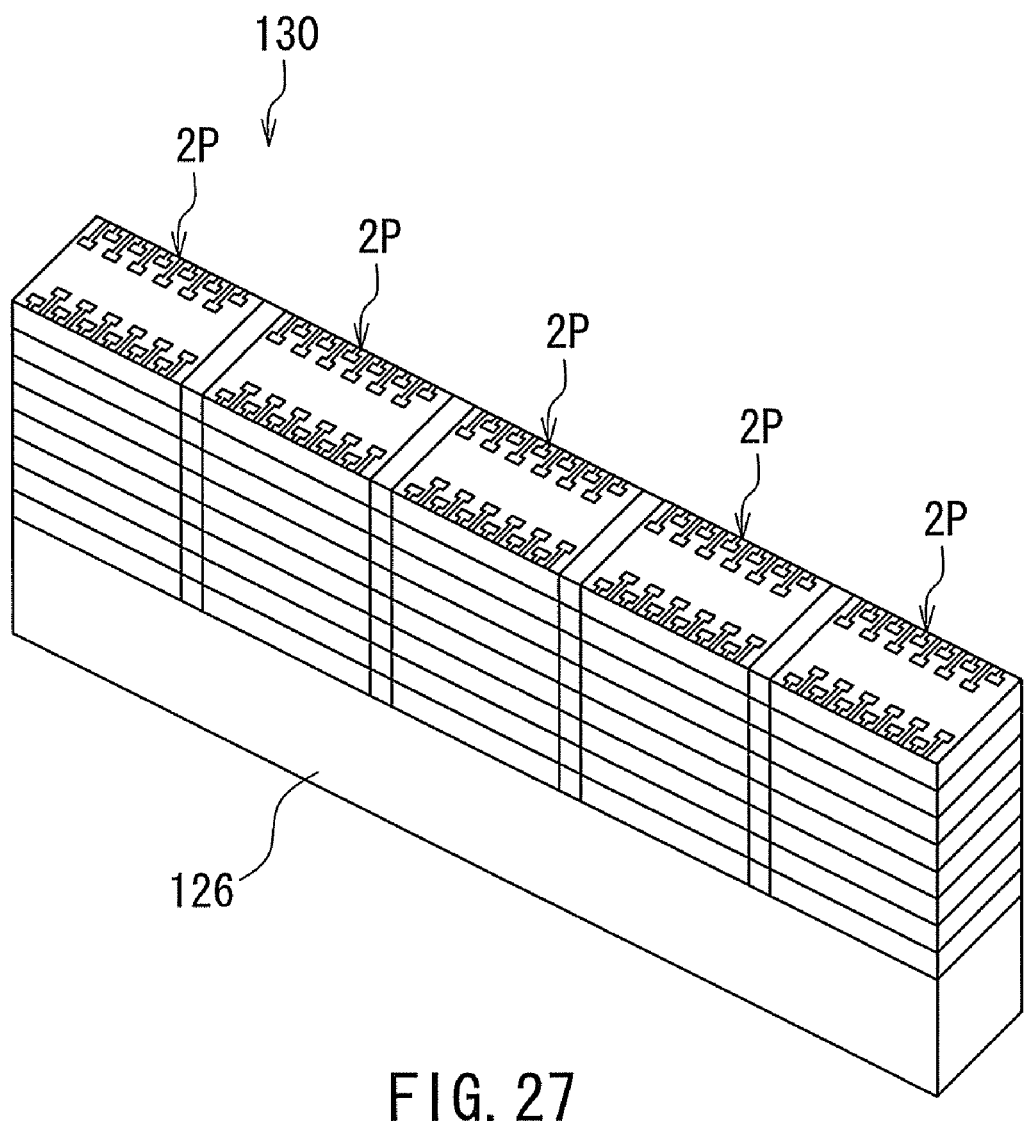
FIG. 27 is a perspective view showing another example of the block formed in the step of FIG. 25.

A description will now be given of the step of producing a plurality of layered chip packages 1 by using the layered substructure 122. In this step, first, as shown in FIG. 25, the layered substructure 122 is cut with a dicing saw along the first grooves 104A of FIG. 14 to form a plurality of blocks 130. FIG. 26 shows an example of the block 130. FIG. 27 shows another example of the block 130. As shown in FIG. 26 and FIG. 27, each block 130 includes a plurality of pre-separation main bodies 2P that are arranged in one direction that is orthogonal to the stacking direction of the plurality of layer portions 10 of the layered chip package 1. The pre-separation main bodies 2P are to be separated from each other later into individual main bodies 2. The block 130 shown in FIG. 26 is obtained by cutting a layered substructure 122 that has alignment marks 123 provided on the second surface 110b of the substructure 110B and the second surface 110b of the substructure 110₁ at the positions of the boundaries between every two adjacent pre-separation main bodies 2P. The block 130 shown in FIG. 27 is obtained by cutting a layered substructure 122 that does not have any alignment marks 123. While FIG. 26 and FIG. 27 show an example where the block 130 includes five pre-separation main bodies 2P, the block 130 can include any plural number of pre-separation main bodies 2P.

The layered substructure 122 may be cut in the state where the layered substructure 122 is bonded onto a plate-shaped jig or to a wafer sheet that is typically used for dicing a wafer. FIG. 25 shows the example of cutting the layered substructure 122 in the state where the layered substructure 122 is bonded onto a plate-shaped jig 125. While the jig 125 is not cut in FIG. 25, the jig 125 may be cut together with the layered substructure 122.

As shown in FIG. 26 and FIG. 27, the block 130 has a top surface, a bottom surface, and four side surfaces. A jig 126 may be bonded to the bottom surface of the block 130. The jig 126 may be a cut piece of the jig 125 which was bonded to the layered substructure 122 when cutting the layered substructure 122.

Figure 28:
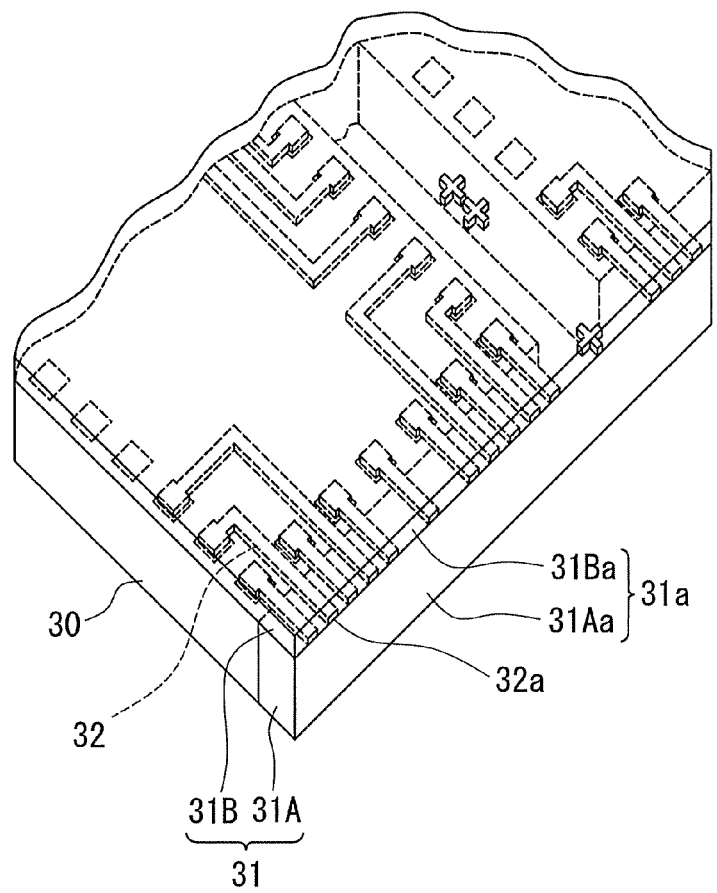
FIG. 28 is a perspective view showing a part of the block formed in the step of FIG. 25.

In the step of cutting the layered substructure 122, the insulating layer 106 is cut to form a cut surface along the direction in which the first groove 104A of FIG. 14 extends. FIG. 28 shows a part of the block 130 formed by cutting the layered substructure 122. As shown in FIG. 28, the insulating layer 106 is cut into an insulating layer 31A. The insulating layer 31A forms a part of the insulating portion 31. The cut surface of the insulating layer 106, i.e., a cut surface 31Aa of the insulating layer 31A, forms a part of the end face 31a of the insulating portion 31.

In the step of cutting the layered substructure 122, the insulating layer 111 covering the electrodes 32 is also cut when the insulating layer 106 is cut. The insulating layer 111 is cut into an insulating layer 31B. The insulating layer 31B forms another part of the insulating portion 31. The cut surface of the insulating layer 111, i.e., a cut surface 31Ba of the insulating layer 31B, forms another part of the end face 31a of the insulating portion 31.

In the step of cutting the layered substructure 122, cutting the insulating layer 106 exposes the end faces 32a of the plurality of electrodes 32 from the end face 31a of the insulating portion 31. The end faces 32a are surrounded by the insulating portion 31.

By cutting the layered substructure 122, the end faces 32a of the plurality of electrodes 32 appear at two of the four side surfaces of the block 130. The two side surfaces are each parallel to the direction in which the plurality of pre-separation main bodies 2P are arranged. To be more specific, the end faces 32Aa of the plurality of electrodes 32A of all the preliminary layer portions 10P included in the block 130 appear at one of the above two side surfaces of the block 130, whereas the end faces 32Ba of the plurality of electrodes 32B of all the preliminary layer portions 10P included in the block 130 appear at the other of the two side surfaces of the block 130 that is opposite to the foregoing side surface.

In the step of producing a plurality of layered chip packages 1, the two side surfaces of the block 130 at which the end faces 32a of the electrodes 32 appear are polished after the cutting of the layered substructure 122. Next, the wiring 3A and the wiring 3B are formed on the pre-separation main bodies 2P of the block 130. In the step of forming the wiring 3A and the wiring 3B, a plurality of blocks 130 may be arranged in the direction of stacking of the plurality of preliminary layer portions 10P so as to form the wiring 3A and the wiring 3B on the pre-separation main bodies 2P of the plurality of blocks 130 simultaneously. This makes it possible to form the wiring 3A and the wiring 3B on a large number of pre-separation main bodies 2P in a short time.

Figure 29:
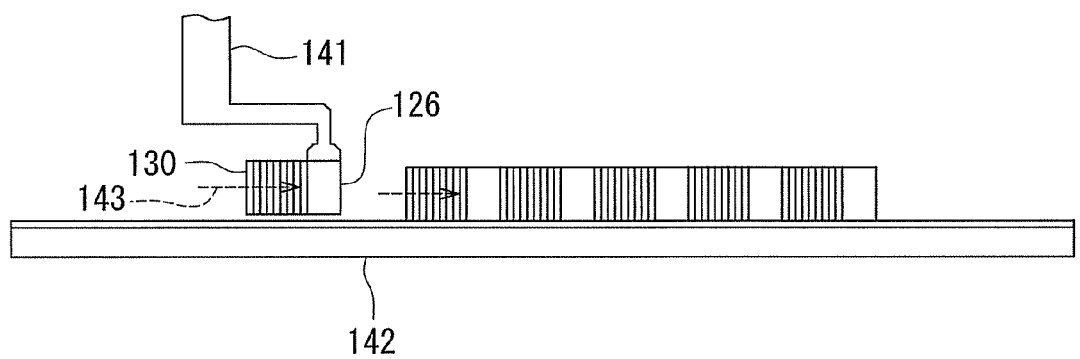
FIG. 29 is an explanatory diagram showing an example of a method of arranging a plurality of blocks in the method of manufacturing the layered chip package according to the embodiment of the invention.
Figure 30:
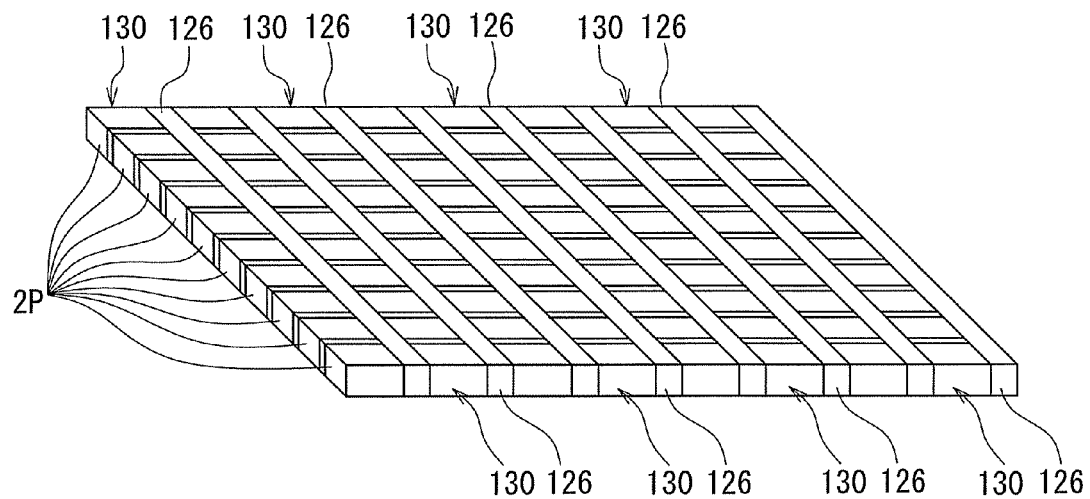
FIG. 30 is a perspective view showing a state where a plurality of blocks are arranged with a jig bonded to each of the blocks.

FIG. 29 shows an example of a method of arranging a plurality of blocks 130. In this example, a plurality of blocks 130 each with a jig 126 bonded thereto are arranged on a table 142 while performing alignment by using a chip bonding apparatus that is capable of recognizing and controlling the positions of chips. The blocks 130 are arranged in the direction of stacking of the plurality of preliminary layer portions 10P. Reference numeral 141 in FIG. 29 indicates a head for holding a chip. In this example, a block 130 with the jig 126 bonded thereto is held by the head 141 and placed to a desired position on the table 142 while recognizing and controlling the position of the block 130. FIG. 30 shows a state where a plurality of blocks 130 each with the jig 126 bonded thereto are arranged in the stacking direction of the plurality of preliminary layer portions 10P. The plurality of blocks 130 thus arranged may be easily detachably bonded together for fixation.

When arranging the plurality of blocks 130, the position of the edge of each block 130 and/or the positions of the end faces 32a of the electrodes 32 that appear at the side surfaces of each block 130 may be recognized with an image recognizer included in the chip bonding apparatus. It is thereby possible to recognize and control the position of each block 130.

Figure 31:
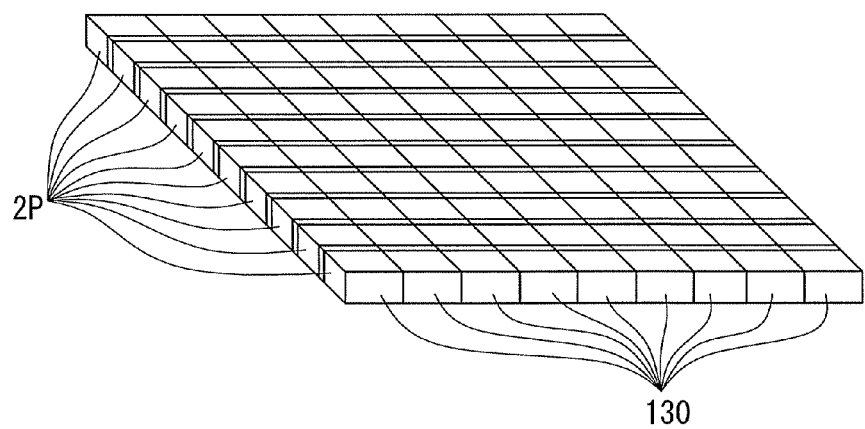
FIG. 31 is a perspective view showing a state where a plurality of blocks are arranged without any jig bonded thereto.

Alternatively, a plurality of blocks 130 each without the jig 126 bonded thereto may be arranged in the stacking direction of the plurality of preliminary layer portions 10P while performing alignment. FIG. 31 shows the plurality of blocks 130 arranged in such a manner. In this case also, the plurality of blocks 130 thus arranged may be easily detachably bonded together for fixation.

In the case of arranging a plurality of blocks 130 each without the jig 126 bonded thereto, if the portion to become the insulating portion 31 is transparent and at least either the alignment marks 107 or the alignment marks 123 are thus observable, the position of each block 130 may be recognized and controlled by recognizing at least either the alignment marks 107 or the alignment marks 123 through the use of the image recognizer included in the chip bonding apparatus. In this case, the alignment marks are observed in the direction of the arrow 143 in FIG. 29.

Figure 32:
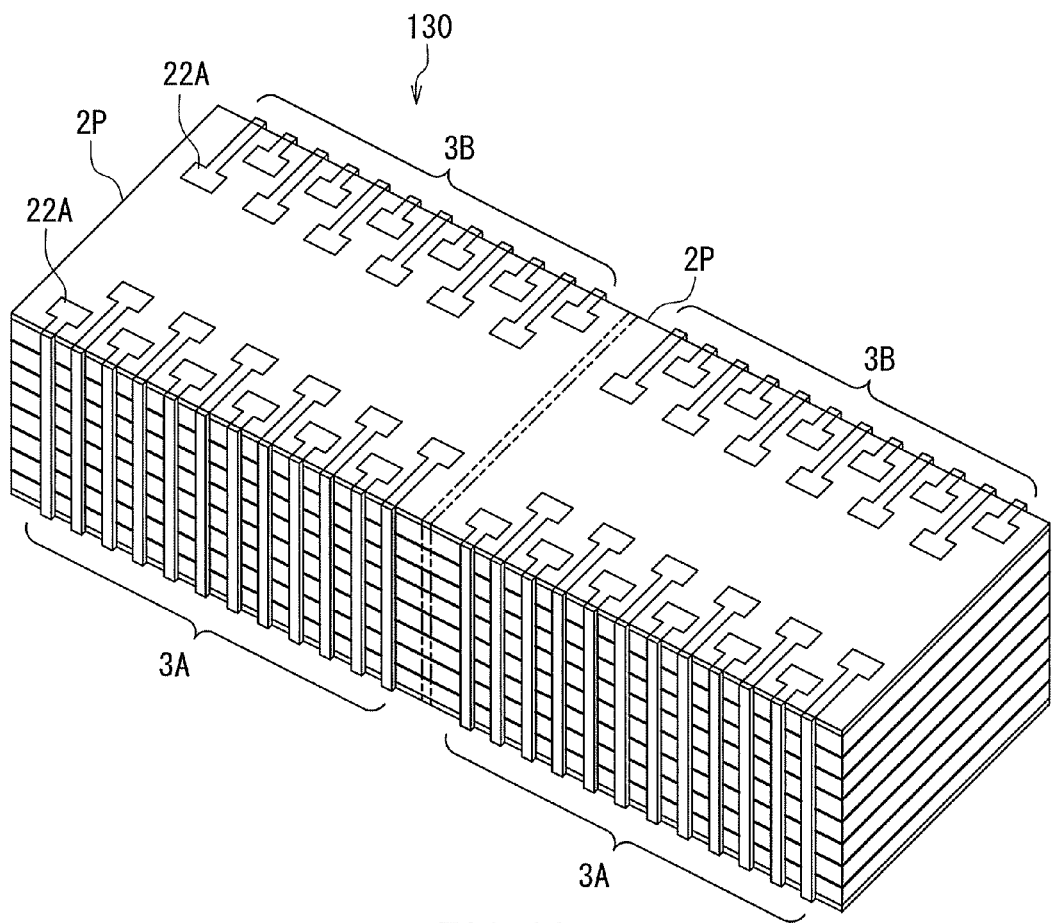
FIG. 32 is a perspective view showing a part of the block with the wiring formed thereon.

Reference is now made to FIG. 32 to describe the step of forming the wiring 3A and the wiring 3B. In this step, first, the wiring 3A is formed on the plurality of pre-separation main bodies 2P included in the block 130 simultaneously. Next, the wiring 3B is formed on the plurality of pre-separation main bodies 2P included in the block 130 simultaneously. The wiring 3A and the wiring 3B are formed by frame plating, for example. In this case, a seed layer for plating is initially formed on the side surface of the block 130 on which the wiring 3A is to be formed. Next, a frame having grooves is formed on the seed layer. The frame is formed by patterning a photoresist film by photolithography, for example. Next, plating layers to become portions of the wiring 3A are formed by plating on the seed layer in the grooves of the frame. Next, the frame is removed and the seed layer except portions thereof lying under the plating layers is also removed by etching. As a result, the wiring 3A is formed of the plating layers and the portions of the seed layer remaining under the plating layers. Next, the wiring 3B is formed in the same way as the wiring 3A on the side surface of the block 130 on which the wiring 3B is to be formed. FIG. 32 shows a part of the block 130 with the wiring 3A and the wiring 3B formed thereon.

Figure 33:
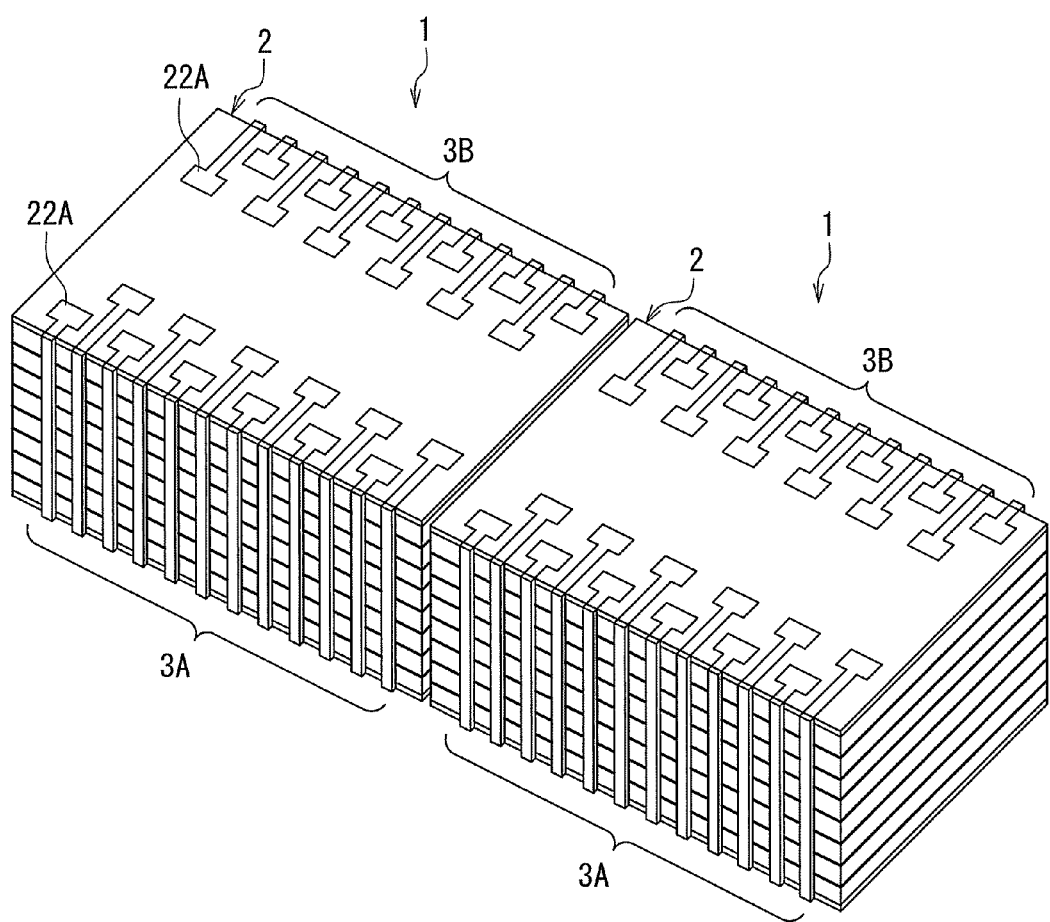
FIG. 33 is a perspective view showing a plurality of layered chip packages formed by cutting the block.
Figure 34:
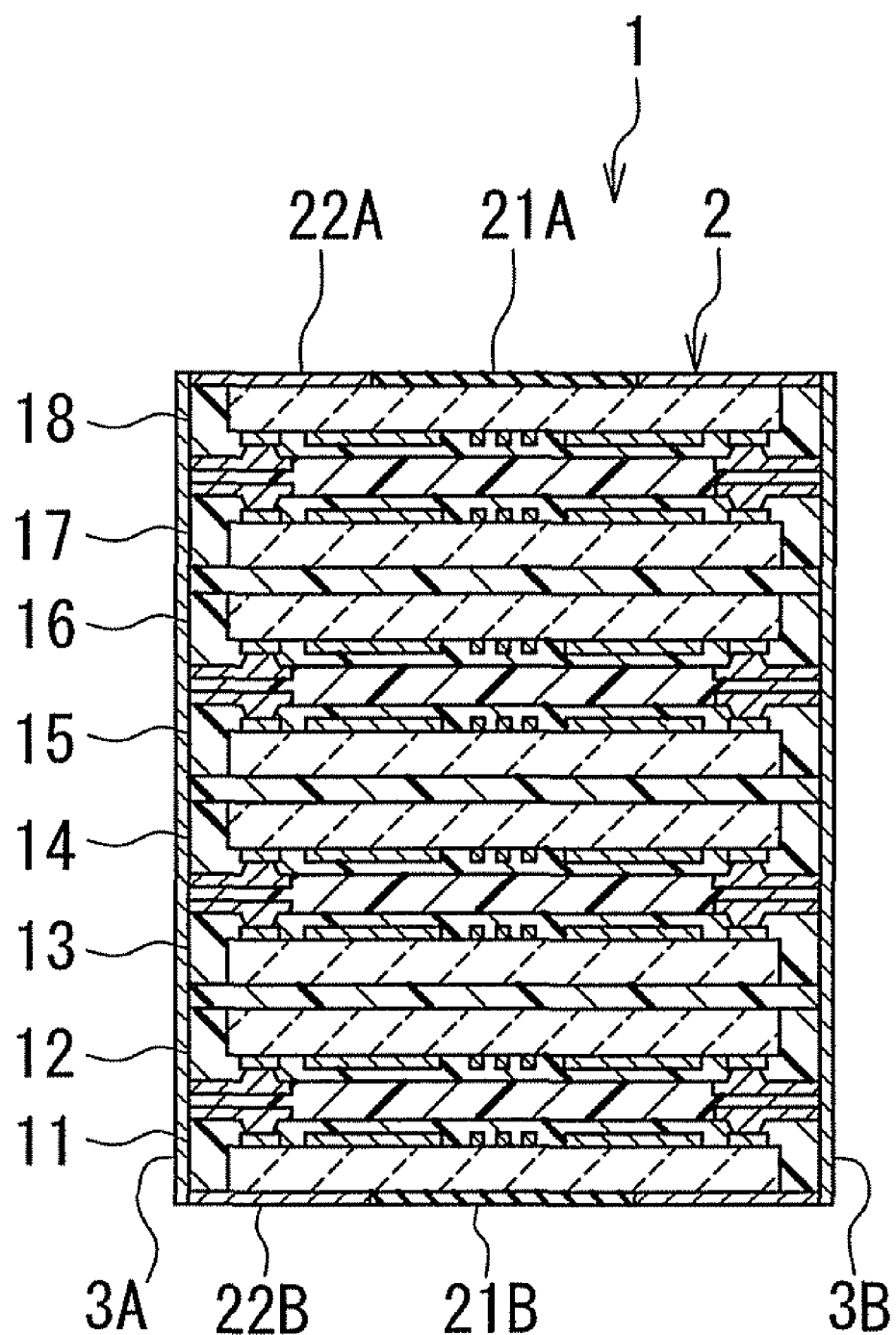
FIG. 34 is a cross-sectional view of the layered chip package according to the embodiment of the invention.

Reference is now made to FIG. 33 to describe the step of cutting the block 130. In this step, the block 130 is cut to separate the plurality of pre-separation main bodies 2P included therein from each other into individual main bodies 2 so that a plurality of layered chip packages 1 are formed. In this way, as shown in FIG. 33, a plurality of layered chip packages 1 are manufactured at a time. FIG. 34 is a cross-sectional view of a single layered chip package 1.

The layered chip package 1 according to the present embodiment can be used by itself as a single electronic component. For example, the layered chip package 1 can be mounted on a wiring board by a flip-chip technique so that the plurality of first terminals 22A or the plurality of second terminals 22B are connected to a conductor layer on the wiring board.

For example, if a device for use with the layered chip package 1 has a recessed portion to accommodate the layered chip package 1, the layered chip package 1 can be inserted to the recessed portion so as to connect the plurality of first terminals 22A or the plurality of second terminals 22B to circuits in the device.

The plurality of first terminals 22A or the plurality of second terminals 22B of the layered chip package 1 may be connected to a plurality of terminals of a device for use with the layered chip package 1 via a plurality of bonding wires.

Figure 35:
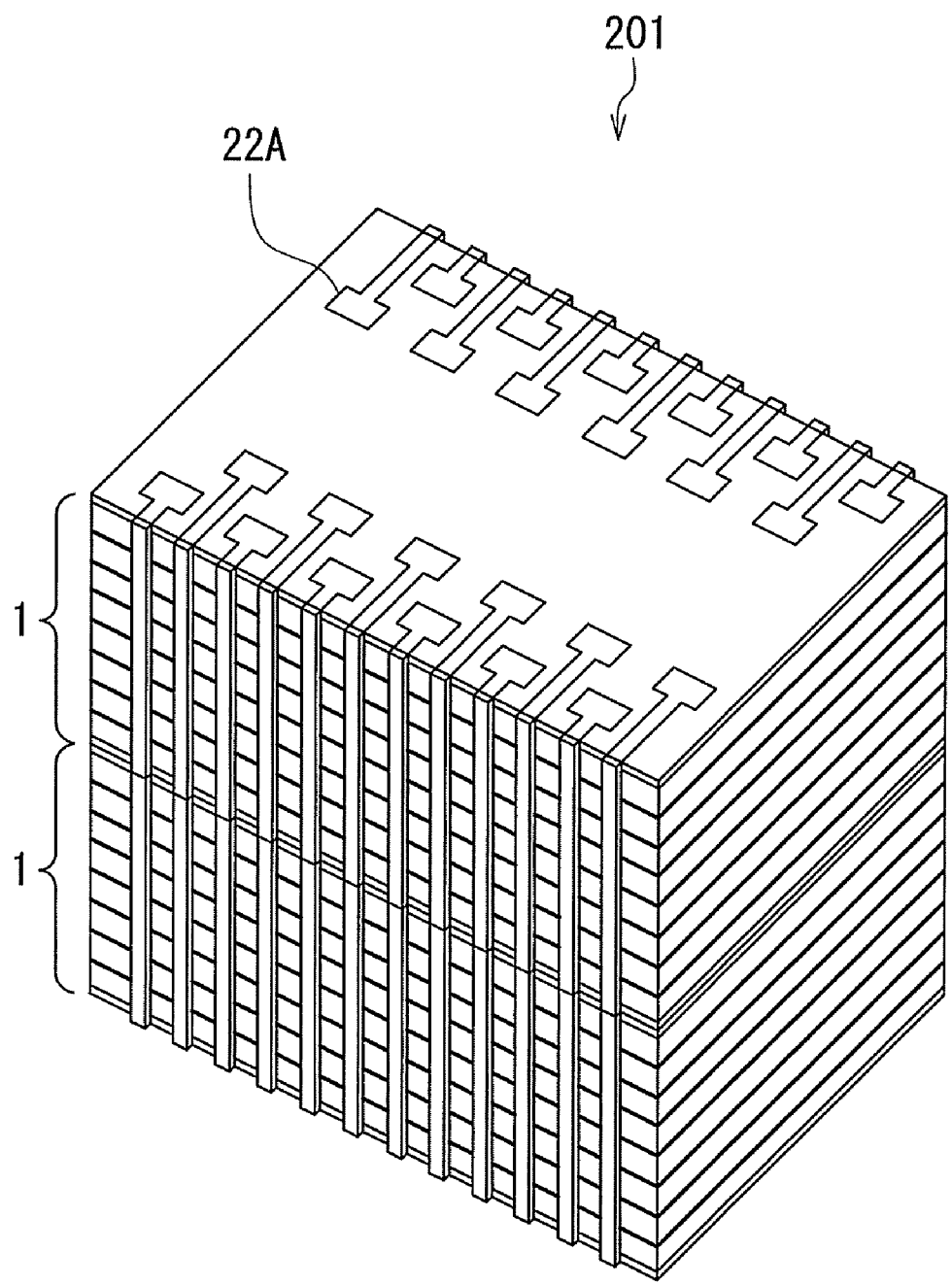
FIG. 35 is a perspective view showing an example of use of the layered chip package according to the embodiment of the invention.

FIG. 35 shows an example of use of the layered chip package 1. In this example, a plurality of layered chip packages 1 are stacked and two vertically adjacent layered chip packages 1 are electrically connected to each other to form an electronic component 201. While FIG. 35 shows a case where the electronic component 201 is composed of a stack of two layered chip packages 1, three or more layered chip packages 1 may be stacked to constitute an electronic component 201. In the electronic component 201, the two vertically adjacent layered chip packages 1 are configured so that the first terminals 22A of the lower layered chip package 1 are electrically connected to the second terminals 22B of the upper layered chip package 1. The two vertically adjacent layered chip packages 1 are bonded to each other with an insulating adhesive, for example.

The example shown in FIG. 35 makes it possible that, if any of the plurality of layered chip packages 1 constituting the electronic component 201 includes a defective semiconductor chip 30, the layered chip package 1 including the defective semiconductor chip 30 can be replaced with a new one to rework the electronic component 201 into a conforming one. The rework of the electronic component 201 is easier than the rework of a layered chip package 1 that includes as many layer portions 10 as the number of layer portions 10 included in the electronic component 201. The foregoing example therefore has the advantage of facilitating the rework of the electronic component 201 including a plurality of layer portions 10.

As described so far, according to the present embodiment, it is possible to provide a layered chip package 1 that includes a plurality of chips 30 stacked and that is capable of achieving higher integration. The layered chip package 1 according to the present embodiment includes a main body 2 having a top surface, a bottom surface and four side surfaces, and wiring 3 disposed on at least one of the side surfaces of the main body 2. The main body 2 includes a plurality of layer portions 10 stacked. Each of the plurality of layer portions 10 includes: a semiconductor chip 30 having a first surface with a device formed thereon, a second surface opposite to the first surface, and four side surfaces; an insulating portion 31 covering at least one of the four side surfaces of the semiconductor chip 30; and a plurality of electrodes 32 connected to the semiconductor chip 30. The plurality of layer portions 10 include two or more pairs of layer portions 10, each pair of layer portions 10 being arranged so that the first surfaces 30a of the respective semiconductor chips 30 face each other. The insulating portion 31 has at least one end face 31a located in the at least one of the side surfaces of the main body 2 on which the wiring 3 is disposed. Each of the plurality of electrodes 32 has an end face 32a that is surrounded by the insulating portion 31 and located in the at least one of the side surfaces of the main body 2 on which the wiring 3 is disposed. The wiring 3 is connected to the end faces 32a of the plurality of electrodes 32 of the plurality of layer portions 10.

According to the present embodiment, the stacked semiconductor chips 30 are electrically connected to each other by the wiring 3 that is disposed on at least one of the side surfaces of the main body 2. Consequently, the present embodiment is free from the problems of the wire bonding method, that is, the problem that it is difficult to reduce the distance between electrodes so as to avoid contact between wires, and the problem that the high resistances of the wires hinder the acceleration of operation of the circuit.

As compared with the through electrode method, the present embodiment has the following advantages. First, the present embodiment does not require the formation of through electrodes in each chip and consequently does not require a large number of steps for forming through electrodes in each chip.

According to the present embodiment, electrical connection between the plurality of semiconductor chips 30 is established by the wiring 3 disposed on at least one of the side surfaces of the main body 2. The present embodiment thus provides higher reliability of electrical connection between chips as compared with the case where through electrodes are used to establish electrical connection between chips.

Furthermore, according to the present embodiment, it is possible to easily change the line width and thickness of the wiring 3. Consequently, it is possible to easily cope with future demands for finer wiring 3.

The through electrode method requires that the through electrodes of upper and lower chips be connected to each other by means of, for example, soldering at high temperatures. In contrast, according to the present embodiment, it is possible to form the wiring 3 at lower temperatures since the wiring 3 can be formed by plating. According to the present embodiment, it is also possible to bond the plurality of layer portions 10 to each other at low temperatures. Consequently, it is possible to prevent the chips 30 from suffering damage from heat.

The through electrode method further requires accurate alignment between upper and lower chips in order to connect the through electrodes of the upper and lower chips to each other. In contrast, according to the present embodiment, electrical connection between the semiconductor chips 30 is established not at an interface between two vertically adjacent layer portions 10 but through the use of the wiring 3 disposed on at least one of the side surfaces of the main body 2. The alignment between the plurality of layer portions 10 therefore requires lower accuracy than that required for the alignment between a plurality of chips in the through electrode method.

According to the through electrode method, the through electrodes of upper and lower chips are connected to each other by means of, for example, soldering. Consequently, if the plurality of chips stacked include one or more defective chips, it is difficult to replace the defective chip(s) with conforming chip(s). In contrast, according to the present embodiment, it is easy to replace one or more defective chips, if included in the layered chip package 1, with conforming chip(s). To replace a defective chip with a conforming one, the wiring 3 is initially removed by polishing, for example. Next, the main body 2 is disassembled to separate at least a layer portion 10 that includes the defective chip 30 from the other layer portions 10, and the defective chip 30 is taken out. According to the present embodiment, since every two vertically adjacent layer portions 10 are bonded to each other with an adhesive, it is easy to separate them from each other. Next, the main body 2 is reconstructed with a conforming chip 30 in place of the defective chip 30. Next, polishing is performed on the side surface(s) of the reconstructed main body 2 on which the wiring 3 is to be formed. The wiring 3 is then formed on the polished side surface(s).

The method of manufacturing the layered chip package 1 according to the present embodiment includes the steps of: fabricating a layered substructure 122 that includes at least one set of first to fourth substructures 110 stacked; and producing a plurality of layered chip packages 1 using the layered substructure 122.

In the step of fabricating the layered substructure 122, one or more sets of first to fourth pre-polishing substructures 109 are initially fabricated. Each pre-polishing substructure 109 is fabricated by processing a first surface 100a of a single semiconductor wafer 100 having the first surface 100a and a second surface 100b. Each pre-polishing substructure 109 includes an array of a plurality of pre-semiconductor-chip portions 30P that are to become individual semiconductor chips 30, and has a first surface 109a and a second surface 109b that respectively correspond to the first surface 100a and the second surface 100b of the semiconductor wafer 100.

Next, as shown in FIG. 10, the first and second pre-polishing substructures 1091 and 1092 are bonded to each other such that their respective first surfaces 109a face each other, whereby a first pre-polishing stack 1191P is formed. Next, as shown in FIG. 11, the second surface 109b of the second pre-polishing substructure 1092 of the first pre-polishing stack 1191P is polished. The second pre-polishing substructure 1092 is thus thinned by the polishing into a second substructure 1102. This forms a first stack 1191 including the first pre-polishing substructure 1091 and the second substructure 1102.

Similarly, the third and fourth pre-polishing substructures 1093 and 1094 are bonded to each other such that their respective first surfaces 109a face each other, whereby a second pre-polishing stack 1192P is formed. Next, the second surface 109b of the third pre-polishing substructure 1093 of the second pre-polishing stack 1192P is polished. The third pre-polishing substructure 1093 is thus thinned by the polishing into a third substructure 1103. This forms a second stack 1192 including the third substructure 1103 and the fourth pre-polishing substructure 1094.

Next, as shown in FIG. 15, the first stack 1191 and the second stack 1192 are bonded to each other such that the second substructure 1102 and the third substructure 1103 face each other, whereby a third pre-polishing stack 1201P is formed. Next, as shown in FIG. 16, the second surface 109b of the fourth pre-polishing substructure 1094 of the third pre-polishing stack 1201P is polished. The fourth pre-polishing substructure 1094 is thus thinned by the polishing into a fourth substructure 1104, and the third pre-polishing stack 1201P is thereby made into a third stack 1201.

In the case of fabricating a layered substructure 122 that includes only one set of the first to fourth substructures 110 stacked, the second surface 109b of the first pre-polishing substructure 1091 of the third stack 1201 is then polished. The first pre-polishing substructure 1091 is thus thinned by the polishing into a first substructure 1101.

In the case of fabricating a layered substructure 122 that includes only two sets of the first to fourth substructures 110 stacked as shown in FIG. 21, the following steps are performed after the formation of the third stack 1201 and before the polishing of the second surface 109b of the first pre-polishing substructure 1091 of the third stack 1201. Initially, as shown in FIG. 17, two third stacks 1201 and 1202 of the same configuration are bonded to each other such that their respective fourth substructures 1104 and 1105 face each other, whereby a fourth pre-polishing stack 121P is formed.

Next, as shown in FIG. 18, the second surface 109b of the first pre-polishing substructure 109S of the third stack 1202 is polished. The first pre-polishing substructure 109S is thus thinned by the polishing into a first substructure 110S, and the fourth pre-polishing stack 121P is thereby made into a fourth stack 121. Subsequently, as shown in FIG. 20, the second surface 109b of the first pre-polishing substructure 1091 of the third stack 1201 is polished. The first pre-polishing substructure 1091 is thus thinned by the polishing into the first substructure 1101. As seen above, when the two third stacks 1201 and 1202 are bonded to each other, the step of polishing the second surface of the first pre-polishing substructure of the third stack is performed on each of the two third stacks 1201 and 1202 bonded. A layered substructure 122 that includes only two sets of the first to fourth substructures 110 stacked is thus fabricated.

In the present embodiment, it is possible to fabricate a layered substructure that includes four sets of the first to fourth substructures 110. In such a case, two fourth stacks 121 shown in FIG. 18 are formed initially. The two fourth stacks 121 are then bonded to each other such that their respective first substructures 110S face each other, whereby a fifth pre-polishing stack is formed. Next, the respective second surfaces 109b of the uppermost and lowermost pre-polishing substructures of the fifth pre-polishing stack are polished. The uppermost and lowermost pre-polishing substructures 109 are thus thinned by the polishing into substructures 110, whereby a layered substructure including four sets of the first to fourth substructures 110 is formed. In the present embodiment, it is also possible to fabricate a layered substructure that includes eight or more sets of the first to fourth substructures 110 in the same manner.

Next, a description will be given of the effect of the method of manufacturing the layered chip package 1 according to the present embodiment. If a single pre-polishing substructure 109 is polished into an isolate substructure 110, the substructure 110 is difficult to handle and susceptible to damage since the substructure 110 has a thickness as small as, for example, 30 to 100 μm. In particular, if the pre-polishing substructure 109 is polished into the substructure 110 in such a state that the pre-polishing substructure 109 is bonded onto a plate-shaped jig, then the thin substructure 110 is likely to be damaged when removed from the jig. Moreover, when bonding a plurality of thin substructures 110 to each other to fabricate a layered substructure, the substructures 110 are subjected to a stress and are likely to be damaged. In addition, because of a difference in thermal expansion coefficient between the semiconductor chip 30 and the insulating layer 106 in the substructure 110, the substructure 110 can be curved as it gets thinner. This also makes it difficult to handle the substructure 110 and makes the substructure 110 susceptible to damage.

According to the present embodiment, in the series of steps after the formation of a pre-polishing substructure 109 as shown in FIG. 9 up to the formation of the layered substructure 122 shown in FIG. 21, the structures to be handled (such as the first to third pre-polishing-stacks and the first to third stacks) always include one or two pre-polishing substructures 109. The pre-polishing substructures 109 have a thickness of 1.2 mm or so, for example. In the present embodiment, the structures to be handled in the foregoing series of steps therefore are sufficiently thicker than a single substructure 110. Consequently, according to the present embodiment, the structures are easy to handle and the substructures 110 can be prevented from being damaged in the foregoing series of steps.

The layered substructure 122 of the present embodiment includes two or more pairs of substructures 110 that are bonded to each other such that their respective first surfaces 110a face each other. If a single substructure 110 entails a stress that acts to curve the substructure 110, it is possible according to the embodiment to cancel out the stresses between a pair of substructures 110 bonded. According to the present embodiment, it is therefore possible to maintain the flatness of the substructures 110.

In the present embodiment, the step of producing a plurality of layered chip packages 1 includes the steps of cutting the layered substructure 122 into a block 130 including a plurality of pre-separation main bodies 2P; forming the wiring 3 on the plurality of pre-separation main bodies 2P included in the block 130 simultaneously; and separating the plurality of pre-separation main bodies 2P each having the wiring 3 from each other so that the plurality of layered chip packages 1 are formed. According to the present embodiment, it is thereby possible to efficiently manufacture the layered chip packages 1 with the wiring 3 formed on the side surfaces of the respective main bodies 2.

In the present embodiment, the step of fabricating the layered substructure 122 includes the step of forming a plurality of terminals 22A and 22B corresponding to a plurality of main bodies 2 simultaneously. The step of producing a plurality of layered chip packages 1 includes the step of separating the plurality of pre-separation main bodies 2P from each other after the formation of the plurality of terminals 22A and 22B, so that the plurality of layered chip packages 1 are formed. According to the present embodiment, it is thereby possible to efficiently manufacture the layered chip packages 1 having the terminals 22A and 22B.

The present embodiment thus makes it possible to mass-produce the layered chip packages 1 at low cost in a short time.

According to the method of manufacturing the layered chip package 1 of the present embodiment, it is possible to easily thin a plurality of substructures 110 to form the layered substructure 122 while preventing damage to the substructures 110. The present embodiment thus allows a high-yield manufacture of a layered chip package that achieves a reduction in size and a high level of integration.

The present invention is not limited to the foregoing embodiment, and various modifications may be made thereto. For example, in the foregoing embodiment, a plurality of blocks 130 are arranged and then the wiring 3 is formed on the pre-separation main bodies 2P of the plurality of blocks 130 simultaneously. However, the wiring 3 may be formed on the pre-separation main bodies 2P of a single block 130 without arranging a plurality of blocks 130.

After the main body 2 is formed by cutting the block 130 with the wiring 3 formed thereon, another wiring may be formed on the cut surface of the main body 2 that is formed by cutting the block 130.

It is apparent that the present invention can be carried out in various forms and modifications in the light of the foregoing descriptions. Accordingly, within the scope of the following claims and equivalents thereof, the present invention can be carried out in forms other than the foregoing most preferred embodiment.

What is claimed is:

1. A method of manufacturing a plurality of layered chip packages, each of the layered chip packages comprising a main body having a top surface, a bottom surface, and four side surfaces, the main body including a plurality of layer portions stacked, the plurality of layer portions having their respective semiconductor chips, each of the semiconductor chips having a first surface with a device formed thereon and a second surface opposite to the first surface, the plurality of layer portions including at least two pairs of layer portions, each pair of layer portions being arranged so that the first surfaces of the respective semiconductor chips face each other, the method comprising the steps of:

fabricating a layered substructure that includes at least one set of first to fourth substructures stacked; and producing the plurality of layered chip packages by using the layered substructure, wherein:

each of the first to fourth substructures includes an array of a plurality of preliminary layer portions, each of the preliminary layer portions being intended to become any one of the plurality of layer portions, the first to fourth substructures being intended to be cut later at a position of a boundary between every adjacent preliminary layer portions; and the step of fabricating the layered substructure includes the steps of:

fabricating first to fourth pre-polishing substructures each by processing a first surface of a semiconductor wafer having the first surface and a second surface that face toward opposite directions, each of the first to fourth pre-polishing substructures including an array of a plurality of pre-semiconductor-chip portions that are intended to become individual semiconductor chips, each of the first to fourth pre-polishing substructures having first and second surfaces that correspond to the first and second surfaces of the semiconductor wafer;

forming a first pre-polishing stack by bonding the first pre-polishing substructure and the second pre-polishing substructure to each other such that the first surface of the first pre-polishing substructure and the first surface of the second pre-polishing substructure face each other;

polishing the second surface of the second pre-polishing substructure of the first pre-polishing stack so that the second pre-polishing substructure is thinned by the polishing into the second substructure to thereby form a first stack that includes the first pre-polishing substructure and the second substructure;

forming a second pre-polishing stack by bonding the third pre-polishing substructure and the fourth pre-polishing substructure to each other such that the first surface of the third pre-polishing substructure and the first surface of the fourth pre-polishing substructure face each other;

polishing the second surface of the third pre-polishing substructure of the second pre-polishing stack so that the third pre-polishing substructure is thinned by the polishing into the third substructure to thereby form a second stack that includes the third substructure and the fourth pre-polishing substructure;

forming a third pre-polishing stack by bonding the first stack and the second stack to each other such that the second substructure and the third substructure face each other;

polishing the second surface of the fourth pre-polishing substructure of the third pre-polishing stack so that the fourth pre-polishing substructure is thinned by the polishing into the fourth substructure and the third pre-polishing stack is thereby made into a third stack; and polishing the second surface of the first pre-polishing substructure of the third stack so that the first pre-polishing substructure is thinned by the polishing into the first substructure.

2. The method of manufacturing the layered chip packages according to claim 1, wherein:

the step of fabricating the layered substructure further includes the step of bonding two third stacks to each other such that their respective fourth substructures face each other, each of the two third stacks being formed through a series of steps from the step of fabricating the first to fourth pre-polishing substructures to the step of polishing the second surface of the fourth pre-polishing substructure of the third pre-polishing stack; and the step of polishing the second surface of the first pre-polishing substructure of the third stack is performed on each of the two third stacks bonded to each other, whereby a layered substructure including two sets of the first to fourth substructures stacked is fabricated.

3. The method of manufacturing the layered chip packages according to claim 1, wherein:

the layered substructure includes an array of a plurality of pre-separation main bodies that are to be separated from each other later into individual main bodies; and the step of producing the plurality of layered chip packages includes the step of separating the plurality of pre-separation main bodies from each other by cutting the layered substructure.

4. The method of manufacturing the layered chip packages according to claim 1, wherein each of the layered chip packages further comprises wiring disposed on at least one of the side surfaces of the main body, and a plurality of electrodes that electrically connect at least one of the semiconductor chips to the wiring.

5. The method of manufacturing the layered chip packages according to claim 4, wherein the step of producing the plurality of layered chip packages includes the steps of forming a block by cutting the layered substructure, the block including a plurality of pre-separation main bodies that are to be separated from each other later into individual main bodies; forming the wiring on the plurality of pre-separation main bodies included in the block simultaneously; and separating the plurality of pre-separation main bodies each having the wiring from each other so as to form the plurality of layered chip packages.

6. The method of manufacturing the layered chip packages according to claim 4, wherein each of the layered chip packages further comprises a plurality of terminals that are disposed on at least one of the top surface and the bottom surface of the main body and are electrically connected to the wiring.

7. The method of manufacturing the layered chip packages according to claim 6, wherein:

the layered substructure includes an array of a plurality of pre-separation main bodies that are to be separated from each other later into individual main bodies;

the step of fabricating the layered substructure further includes the step of forming the plurality of terminals corresponding to a plurality of main bodies simultaneously; and the step of producing the plurality of layered chip packages includes the step of separating the plurality of pre-separation main bodies from each other after the formation of the plurality of terminals so as to form the plurality of layered chip packages.

* * * * *